(12) United States Patent
Hoshi

(10) Patent No.: US 11,437,509 B2
(45) Date of Patent: Sep. 6, 2022

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 14 days.

(21) Appl. No.: 17/217,620

(22) Filed: Mar. 30, 2021

(65) Prior Publication Data

US 2021/0359128 A1 Nov. 18, 2021

(30) Foreign Application Priority Data

May 14, 2020 (JP) .............................. JP2020-085491

(51) Int. Cl.
*H01L 29/78* (2006.01)
*H01L 29/16* (2006.01)

(52) U.S. Cl.
CPC ...... *H01L 29/7813* (2013.01); *H01L 29/1608* (2013.01)

(58) Field of Classification Search
CPC .................. H01L 29/7813; H01L 29/1608
USPC ....................................................... 257/330
See application file for complete search history.

(56) References Cited

U.S. PATENT DOCUMENTS

| 2011/0018004 A1 | 1/2011 | Shimizu et al. |
| 2014/0264564 A1* | 9/2014 | Cheng ................. H01L 29/1095 438/270 |
| 2018/0197947 A1* | 7/2018 | Iwaya ............... H01L 29/66068 |
| 2019/0165164 A1 | 5/2019 | Kobayashi et al. |
| 2019/0214457 A1* | 7/2019 | Kinoshita ............. H01L 21/049 |
| 2020/0168732 A1 | 5/2020 | Mitani et al. |
| 2020/0258991 A1* | 8/2020 | Hoshi ................ H01L 29/7813 |

FOREIGN PATENT DOCUMENTS

| JP | 2011023675 A | 2/2011 |
| JP | 4678902 B2 | 4/2011 |
| JP | 2017098403 A | 6/2017 |
| JP | 2019046908 A | 3/2019 |
| JP | 2019102555 A | 6/2019 |
| WO | 2017064948 A1 | 4/2017 |

* cited by examiner

*Primary Examiner* — Igwe U Anya

(74) *Attorney, Agent, or Firm* — Rabin & Berdo, P.C.

(57) ABSTRACT

A main semiconductor device element is a vertical MOSFET with a trench gate structure, containing silicon carbide as a semiconductor material, and having first and second $p^+$-type regions that mitigate electric field applied to bottoms of trenches. The first $p^+$-type regions are provided separate from the p-type base regions and face the bottoms of the trenches in a depth direction. The first $p^+$-type regions are disposed at an interval that is at most 1.0 μm, in a first direction that is a direction in which gate electrodes extend. The second $p^+$-type regions are provided between adjacent trenches of the trenches, separate from the first $p^+$-type regions and the trenches, and in contact with the p-type base regions. In the first direction that is the direction in which the trenches, the second $p^+$-type regions extend in a linear shape having a length that is substantially equal to that of the trenches.

7 Claims, 13 Drawing Sheets

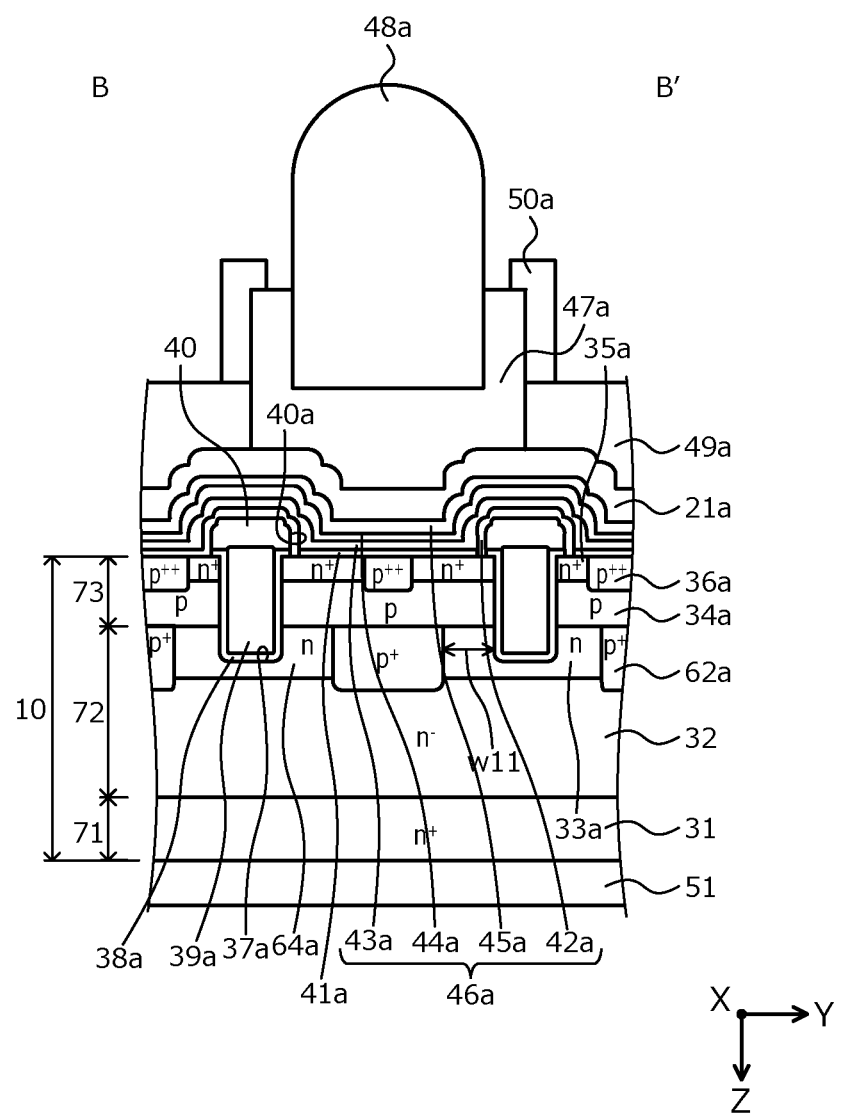

SEMICONDUCTOR DEVICE

CROSS REFERENCE TO RELATED APPLICATIONS

This application is based upon and claims the benefit of priority of the prior Japanese Patent Application No. 2020-085491, filed on May 14, 2020, the entire contents of which are incorporated herein by reference.

BACKGROUND OF THE INVENTION

1. Field of the Invention

Embodiments of the invention relate to a semiconductor device.

2. Description of the Related Art

Among power semiconductor devices that control high voltage and/or large current, there are several types such as bipolar transistors, insulated gate bipolar transistors (IGBTs), and metal oxide semiconductor field effect transistors (MOSFETs) that have insulated gates (MOS gates) having a 3-layered structure including a metal, an oxide film, and a semiconductor. These devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, MOSFETs have low current density compared to bipolar transistors and IGBTs and are difficult to adapt for large current but can be switched at high speeds up to about several MHz.

Further, a MOSFET, unlike an IGBT, has a built-in parasitic diode formed by pn junctions between an n$^-$-type drift region and p-type base regions in a semiconductor substrate (semiconductor chip), the parasitic diode may be used as a freewheeling diode for protecting the MOSFET. Therefore, in an instance in which a MOSFET is used as a device for an inverter, the MOSFET may be used without additionally connecting an external freewheeling diode thereto and is attracting attention from an economical perspective.

Silicon (Si) is used as material for fabricating power semiconductor devices. There is a strong demand in the market for large-current, high-speed power semiconductor devices and thus, IGBTs and power MOSFETs have been intensively developed and improved, and the performance of power devices has substantially reached the theoretical limit determined by the material. Therefore, in terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a bandgap wider than that of silicon (hereinafter, wide bandgap semiconductors), such as, for example, gallium nitride (GaN).

Further, in a MOSFET, configuration of a trench gate structure in which, accompanying large current, a channel (inversion layer) is formed along a sidewall of a trench, in a direction orthogonal to a front surface of a semiconductor chip is advantageous in terms of cost as compared to a planar gate structure in which the channel is formed along the front surface of the semiconductor chip. A reason for this is that unit cell (configuration unit of a device element) density per unit area may be increased with a trench gate structure and therefore, current density per unit area may be increased.

A rate of temperature rise relative to a volume occupied by the unit cells increases by an extent to which device current density is increased and therefore, to enhance discharge efficiency and stabilize reliability, a double-sided cooling structure is necessary. Further, a power semiconductor device that enhances reliability by having a high-function structure in which, on a single semiconductor substrate having a main semiconductor device element that performs a main operation of the power semiconductor device, high-function portions such as a current sensing portion, a temperature sensing portion, and an over-voltage protecting portion are disposed as circuit portions for protecting and controlling the main semiconductor device element.

A structure of a conventional semiconductor device is described. FIG. 13 is a cross-sectional view depicting the structure of the conventional semiconductor device. FIG. 13 depicts a cross-sectional view of the structure along cutting line AA-AA' in FIG. 14. FIG. 14 is a plan view of a layout of a portion of the conventional semiconductor device when the conventional semiconductor device is viewed from a front side of a semiconductor substrate. In FIG. 14, a layout of first and the second p$^+$-type regions 261, 262 (hatched portions) that mitigate electric field applied to bottoms of trenches 237 of a main semiconductor device element is depicted.

A conventional semiconductor device 220 depicted in FIGS. 13 and 14 includes as the main semiconductor device element, a vertical MOSFET in which MOS gates having a general trench gate structure are provided in a semiconductor substrate (semiconductor chip) 210, at a front surface of the semiconductor substrate 210 containing silicon carbide. The semiconductor substrate 210 is formed by sequentially forming silicon carbide layers 272, 273 that form an n$^-$-type drift region 232 and p-type base regions 234, by epitaxial growth on a front surface of an n$^+$-type starting substrate 271 containing silicon carbide.

The semiconductor substrate 210 has a first main surface that is a surface of the p-type silicon carbide layer 273 and regarded as a front surface and a second main that is a surface of the n$^+$-type starting substrate 271 and regarded as a back surface. The MOS gates are configured by the p-type base regions 234, n$^+$-type source regions 235, p$^{++}$-type contact regions 236, the trenches 237, gate insulating films 238, and gate electrodes 239. The trenches 237 are disposed in a stripe pattern extending in a first direction X (vertical direction in FIG. 14) parallel to the front surface of the semiconductor substrate 210.

In the semiconductor substrate 210, the first and the second p$^+$-type regions 261, 262 that mitigate electric field applied to the bottoms of the trenches 237 are disposed at positions closer to an n$^+$-type drain region 231 than are the p-type base regions 234. The first p$^+$-type regions 261 are disposed separate from the p-type base regions 234, extending in a linear shape in the first direction X that is a same direction in which the trenches 237 extend, and face the bottoms of the trenches 237 in a depth direction Z, respectively.

The second $p^+$-type regions 262 are each provided between adjacent trenches 237 of the trenches 237, separate from the first $p^+$-type regions 261 and the trenches 237, and in contact with one of the p-type base regions 234. The second $p^+$-type regions 262 extend in a linear shape in the first direction X that is the same direction in which in the trenches 237 extend. A metal silicide film 241 that functions as a source electrode, a barrier metal 246, and a source pad 221 are sequentially stacked on the front surface of the semiconductor substrate 210.

A double-sided cooling structure is configured by a wiring structure on the source pad 221 and a cooling fin (not depicted) joined to a drain electrode 251 of the back surface of the semiconductor substrate 210. Reference characters 233, 240, and 240a are n-type current spreading regions, an interlayer insulating film, and contact holes. Reference characters 242, 243, 244, and 245 are metal films configuring the barrier metal 246. Reference characters 247, 248, 249, and 250 are parts configuring the wiring structure on the source pad 221.

As a conventional vertical MOSFET having a trench gate structure, a device has been proposed in which n-type regions are provided that make a depth of trenches (gate trenches) shallower than a depth of p-type base regions and reach an n-type drift region at bottoms of the trenches (for example, refer to Japanese Patent No. 4678902). In Japanese Patent No. 4678902, pn junctions between the p-type base regions at positions deeper than the trenches and the n-type drift region are formed, electric field concentrates at the pn junctions, and the electric field does not concentrate at bottom corner portions of the trenches, whereby breakdown tolerance of the gate insulating films is enhanced and breakdown voltage is increased.

As a conventional vertical MOSFET having a trench gate structure, a device has been proposed in which p-type base regions are configured by first regions having a low impurity concentration and a narrow width and second regions having a high impurity concentration and a wide width (for example, refer to Japanese Laid-Open Patent Publication No. 2011-023675). In Japanese Laid-Open Patent Publication No. 2011-023675, by reducing the width and the impurity concentration of the p-type base regions by the first regions, ON resistance is reduced and by further reducing the width of the first regions and increasing the width of the second regions, punch-through is prevented, the breakdown voltage is maintained, and by the second regions that have a high impurity concentration and a wide width, ohmic contact is formed with source electrodes.

As a conventional vertical MOSFET having a trench gate structure, a device has been proposed in which a region between some trenches (gate trenches) that are adjacent to one another and disposed having a short pitch is free of a parasitic transistor (for example, refer to Japanese Laid-Open Patent Publication No. 2017-098403). In Japanese Laid-Open Patent Publication No. 2017-098403, the pitch between some of the adjacent trenches is reduced, hole current that flows when avalanche occurs is concentrated at p-type floating regions at the bottoms of the trenches, and this place of current concentration is set as a region free of a parasitic transistor, whereby avalanche tolerance may be enhanced.

As a conventional vertical MOSFET having a trench gate structure, a device has been proposed that has an n-type region between $p^+$-type regions that mitigate electric field applied to trench (gate trench) bottoms, provided between an $n^-$-type drift region and p-type base regions (for example, refer to International Publication No. WO 2017/064948). In International Publication No. WO 2017/064948, the n-type region between the $p^+$-type regions is deeper on a drain side than are the $p^+$-type regions and a path of current flowing along a channel passing between the $p^+$-type regions adjacent to one another does not narrow easily, whereby ON resistance is reduced while the breakdown voltage is maintained as is.

As a conventional vertical MOSFET having a trench gate structure, a device has been proposed that has, between an $n^-$-type drift region and p-type base regions, $p^+$-type regions that mitigate electric field applied to trench (gate trench) bottoms, and a portion of the $p^+$-type regions between adjacent trenches are extended toward the p-type base regions and connected to the p-type base regions (for example, refer to Japanese Laid-Open Patent Publication No. 2019-102555). In Japanese Laid-Open Patent Publication No. 2019-102555, the $p^+$-type regions between the adjacent trenches are partially reduced in number, whereby hole current that flows when avalanche occurs is easily discharged to the source electrodes.

As a conventional vertical MOSFET having a trench gate structure, a device has been proposed that has, between an $n^-$-type drift region and p-type base regions, $p^+$-type regions that mitigate electric field applied to trench (gate trench) bottoms, and of these $p^+$-type regions, $p^+$-type regions between adjacent trenches all extend in a linear shape in a same direction as the trenches, and at positions deeper on a drain side than are the trench bottoms, the $p^+$-type regions are disposed in a stripe pattern extending in a direction orthogonal to the trenches (for example, refer to Japanese Laid-Open Patent Publication No. 2019-046908).

In Japanese Laid-Open Patent Publication No. 2019-046908, between a trench and a $p^+$-type region that are adjacent to one another in a direction parallel to the front surface of the semiconductor substrate, and, between adjacent $p^+$-type regions disposed separate from a trench, at positions deeper on the drain side than is the bottom of the trench, an n-type region having an impurity concentration higher than an impurity concentration of the $n^-$-type drift region is disposed. Due to this n-type region, even when the $p^+$-type regions between the $n^-$-type drift region and the p-type base regions are partially disposed, the path of the current that flows along the channel does not narrow easily and the ON resistance is reduced with the breakdown voltage maintained as is.

SUMMARY OF THE INVENTION

According to an embodiment of the invention, a semiconductor device includes a semiconductor substrate containing a semiconductor having a bandgap wider than a bandgap of silicon, the semiconductor substrate having a first main surface and a second main surface opposite to each other; a first semiconductor region of a first conductivity type, provided in the semiconductor substrate; a plurality of second semiconductor regions of a second conductivity type, provided between the first main surface of the semiconductor substrate and the first semiconductor region; a plurality of third semiconductor regions of the first conductivity type, selectively provided between the first main surface of the semiconductor substrate and the second semiconductor regions; a plurality of trenches penetrating through the third semiconductor regions and the second semiconductor regions, respectively and reaching the first semiconductor region; a plurality of first high-concentration regions of the second conductivity type, selectively provided in the first semiconductor region, each facing a bottom of one of the trenches in a depth direction, and having an impurity concentration higher than an impurity concentration of the second semiconductor regions; a plurality of second high-concentration regions of the second conductivity type, selectively provided in the first semiconductor region, separate from any one of the first high-concentration regions and the trenches, each second high-concentration region being in contact with one of the second semiconductor regions, reaching a position further from the second semiconductor regions in the depth direction than are respective bottoms of the trenches and having an impurity concentration higher than the impurity concentration of the second semiconductor regions; a plurality of gate electrodes respectively provided in the trenches via a plurality of gate insulating films; a first electrode electrically connected to the second semiconductor regions, the third semiconductor regions, the first high-concentration regions, and the second high-concentration regions; and a second electrode provided on the second main surface of the semiconductor substrate. The trenches each have a linear shape extending in a first direction that is parallel to the first main surface of the semiconductor substrate. The first high-concentration regions are successively separated in the first direction by intervals therebetween, each of which is at most 1.0 μm. The second high-concentration regions each have a linear shape extending in the first direction.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a cross-sectional view of the active region in FIG. 1.

DETAILED DESCRIPTION OF THE INVENTION

Figure 13:
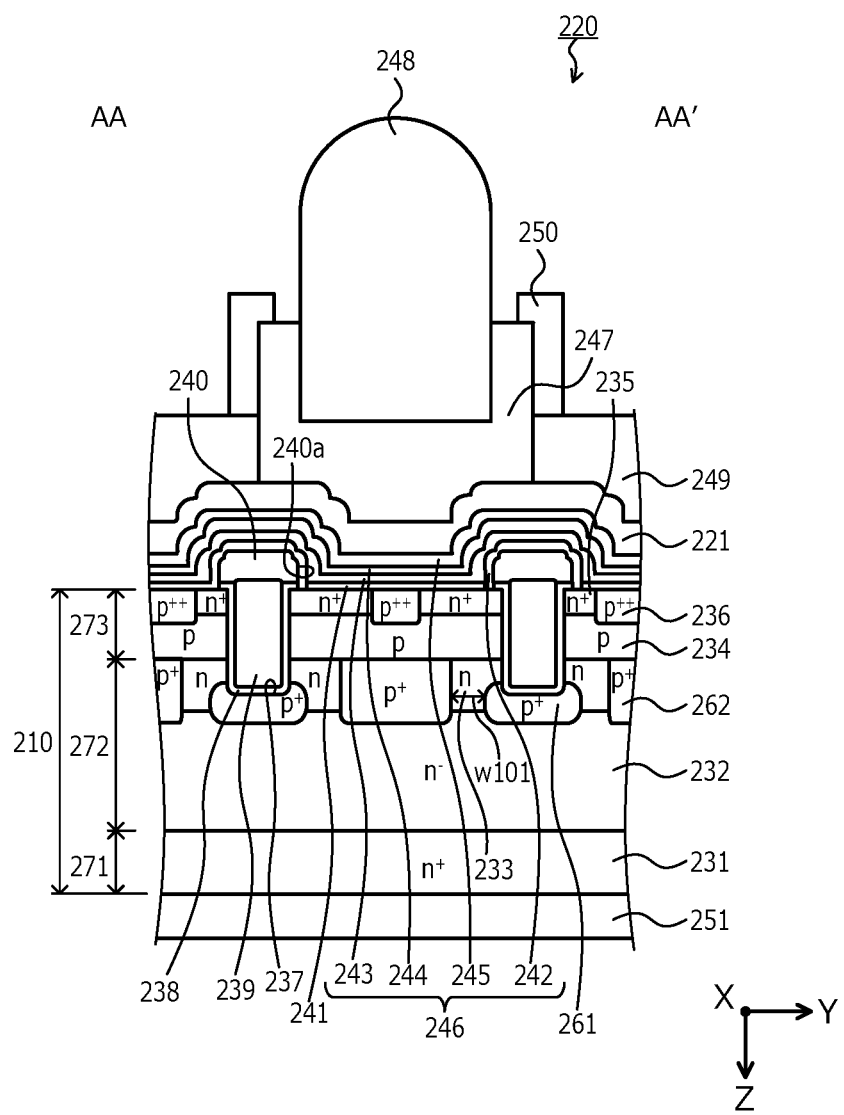
FIG. 13 is a cross-sectional view depicting a structure of a conventional semiconductor device.
Figure 14:
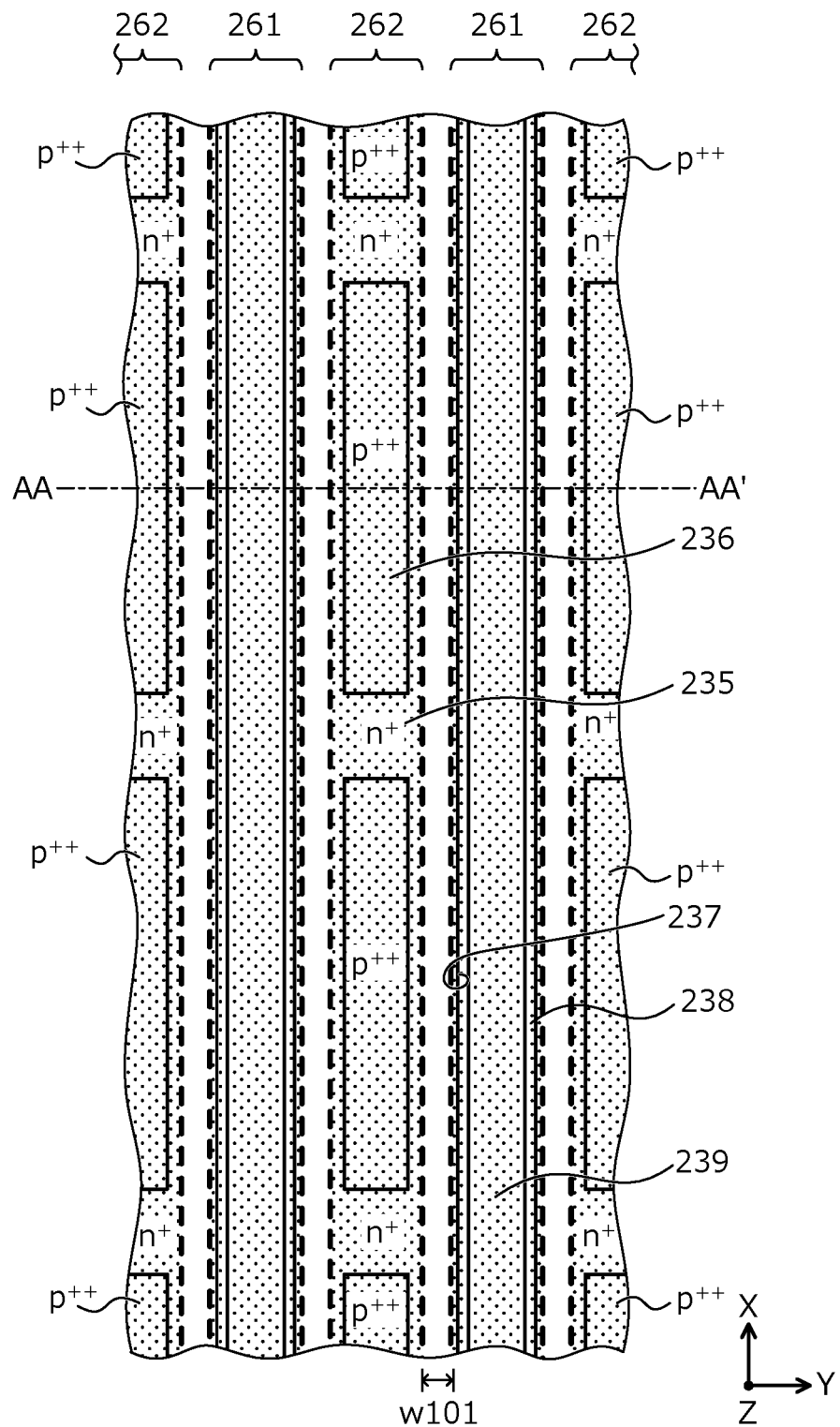
FIG. 14 is a plan view of a layout of a portion of the conventional semiconductor device when the conventional semiconductor device is viewed from a front side of a semiconductor substrate.

First, problems associated with the conventional techniques are discussed. In the main semiconductor device element of the conventional semiconductor device 220 (refer to FIGS. 13 and 14), accompanying miniaturization of the unit cells, a width w101 of the $n^-$-type drift region 232, between the first and the second $p^+$-type regions 261, 262 decreases. At a portion where the width w101 decreases, junction FET (JFET) resistance increases and the ON resistance increases, whereby operating loss (power loss) increases. In particular, in an instance in which the semiconductor device 220 has a high-function structure, the ON resistance of the main semiconductor device element has to be reduced and total operating loss of the semiconductor device 220 has to be reduced.

In an instance in which the semiconductor device 220 has a high-function structure, the main semiconductor device element is operated and controlled by an external circuit, based on output signals of high-function portions (not depicted) such as a current sensing portion and a temperature sensing portion so that short circuit withstand capability, etc. is not exceeded. For the main semiconductor device element alone, it is sufficient to set an applied voltage at which a current that is about 4 times the rated current of the main semiconductor device element flows, as an allowable applied voltage (actual value). Therefore, when the total operating loss of the semiconductor device 220 increases, voltage exceeding the actual value is applied to the main semiconductor device element, and the main semiconductor device element is destroyed or operates erroneously.

Embodiments of a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and will not be repeatedly described.

Figure 1:
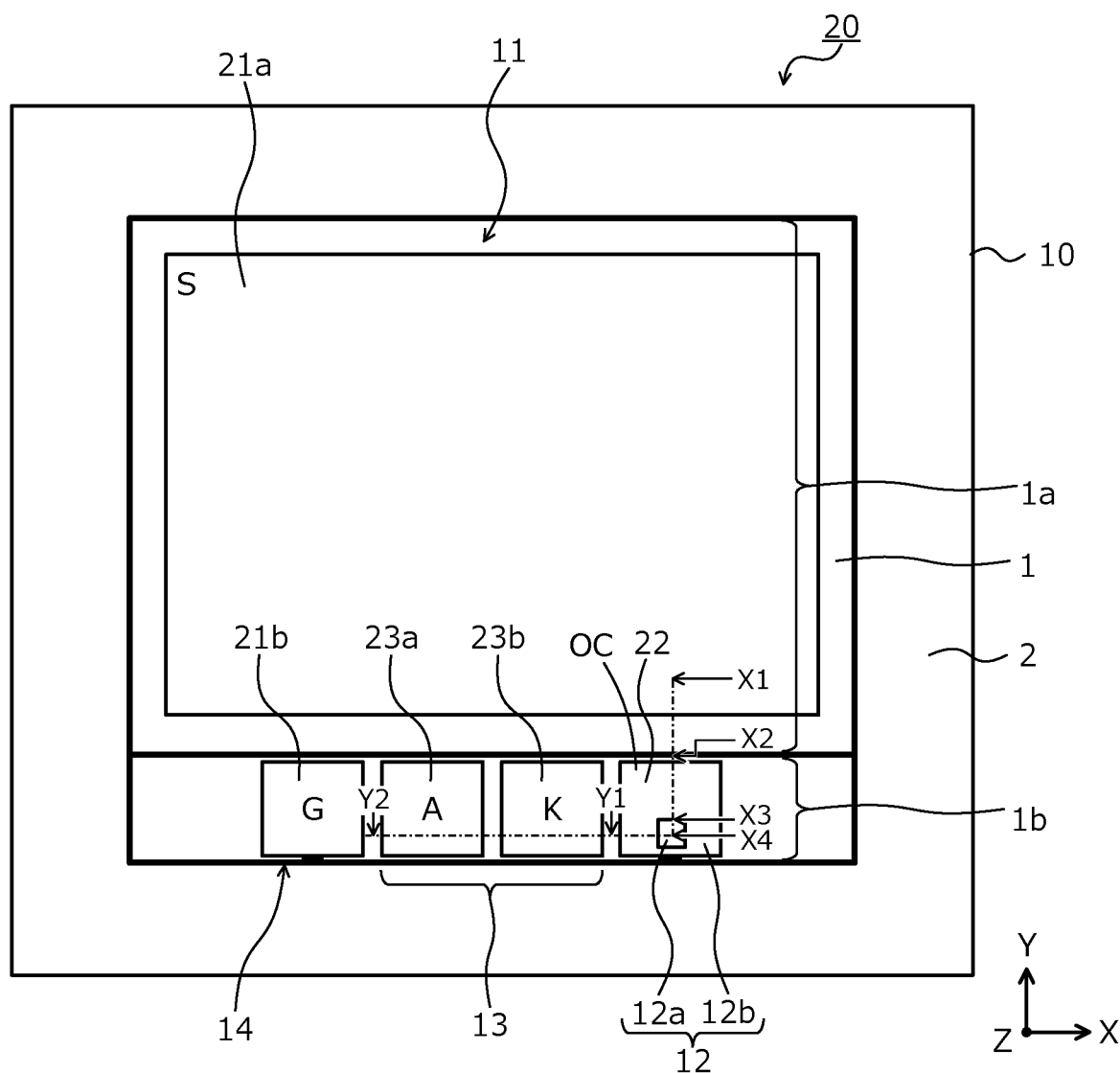
FIG. 1 is a plan view of a layout when a semiconductor device according to an embodiment is viewed from a front side of a semiconductor substrate thereof.

A semiconductor device according to an embodiment is configured using, as a semiconductor, a semiconductor material having a bandgap wider than that of silicon (Si) (wide bandgap semiconductor). Here, a structure of the semiconductor device according to the embodiment is described taking, as an example, an instance in which silicon carbide (SiC) is used as the wide bandgap semiconductor material configuring the semiconductor device according to the embodiment. FIG. 1 is a plan view of a layout when the semiconductor device according to the embodiment is viewed from a front side of a semiconductor substrate thereof.

A semiconductor device 20 according to the embodiment depicted in FIG. 1 has, in an active region 1 of a single semiconductor substrate (semiconductor chip) 10 thereof containing silicon carbide, a main semiconductor device element 11 and at least one circuit portion for protecting and controlling the main semiconductor device element 11. The active region 1 is provided in substantially a center (chip center) of the semiconductor substrate 10. The main semiconductor device element 11 is a vertical MOSFET that performs a main operation of the semiconductor device 20 and is configured by plural unit cells (functional units of a device element) connected in parallel to one another by a source pad 21a described hereinafter.

The main semiconductor device element 11 is disposed in an effective region (hereinafter, main effective region) 1a of the active region 1. The main effective region 1a is a region in which a main current (drift current) of the main semiconductor device element 11 flows in a direction from a back surface of the semiconductor substrate 10, toward a front surface thereof (direction opposite to the depth direction Z), when the main semiconductor device element 11 is ON. The main effective region 1a has, for example, a substantially rectangular shape in a plan view thereof and occupies a majority of a surface area of the active region 1. Three edges of the substantially rectangular shape of the main effective region 1a in a plan view thereof are adjacent to an edge termination region 2 described hereinafter.

The circuit portions for protecting and controlling the main semiconductor device element 11 are, for example, high-function portions such as a current sensing portion 12, a temperature sensing portion 13, an over-voltage protecting portion (not depicted), and an arithmetic circuit portion (not depicted) disposed in a main non-operating region 1b of the active region 1. The main non-operating region 1b is a region free of unit cells of the main semiconductor device element 11 and does not function as the main semiconductor device element 11. The main non-operating region 1b, for example, has a substantially rectangular shape in a plan view thereof and is disposed between a remaining one edge of the substantially rectangular shape of the main effective region 1a in a plan view thereof and the edge termination region 2.

The edge termination region 2 is a region between the active region 1 and an end of the semiconductor substrate 10 (chip end), the edge termination region 2 being adjacent to the active region 1, surrounding a periphery of the active region 1, and having a function of mitigating electric field of a front side of the semiconductor substrate 10 and sustaining breakdown voltage. In the edge termination region 2, for example, a general voltage withstanding structure (not depicted) such as a field limiting ring (FLR) or a junction termination extension (JTE) structure is disposed. The breakdown voltage is a voltage limit at which erroneous operation or destruction of the semiconductor device does not occur.

The source pad (electrode pad) 21a of the main semiconductor device element 11 is disposed on a front surface of the semiconductor substrate 10, in the main effective region 1a. The source pad 21a of the main semiconductor device element 11 is disposed separate from other electrode pads excluding the source pad 21a. The main semiconductor device element 11 has a large current capacity as compared to other circuit portions. Therefore, the source pad 21a of the main semiconductor device element 11 has substantially a same shape as that of the main effective region 1a in a plan view thereof and covers substantially an entire area of the main effective region 1a.

The other electrode pads excluding the source pad 21a are disposed in the main non-operating region 1b, on the front surface of the semiconductor substrate 10, separate from one another. The other electrode pads excluding the source pad 21a are the gate pad 21b of the main semiconductor device element 11, an electrode pad (OC pad) 22 of the current sensing portion 12, electrode pads (anode pad and cathode pad) 23a, 23b of the temperature sensing portion 13, an electrode pad (hereinafter, an OV pad, not depicted) of the over-voltage protecting portion, and an electrode pad (not depicted) of the arithmetic circuit portion, etc.

The other electrode pads excluding the source pad 21a, for example, have a substantially rectangular shape in a plan view thereof and have a surface area necessary for bonding later-described terminal pins 48b, 48c, 48d (refer to FIGS. 3 and 4), wires (not depicted), etc. FIG. 1 depicts an instance in which the other electrode pads excluding the source pad 21a are disposed in a single row along a border between the main non-operating region 1b and the edge termination region 2, in the first direction X. In FIG. 1, the source pad 21a, the gate pad 21b, the OC pad 22, the anode pad 23a, and the cathode pad 23b are depicted as rectangles indicated by "S", "G", "OC", "A", and "K".

The current sensing portion 12 is connected in parallel to the main semiconductor device element 11, operates under conditions similar to those of the main semiconductor device element 11, and has a function of detecting overcurrent (OC) flowing in the main semiconductor device element 11. The current sensing portion 12 is disposed separate from the main semiconductor device element 11. The current sensing portion 12 is a vertical MOSFET having unit cells each configured similarly to the unit cells of the main semiconductor device element 11, the current sensing portion 12 having a fewer number of unit cells (for example, about 10) than the number of unit cells of the main semiconductor device element 11 (for example, at least about one thousand) and having a surface area smaller than that of the main semiconductor device element 11.

The unit cells of the current sensing portion 12 are disposed in a region (hereinafter, sensing effective region, hatched portion) 12a that is a portion of a region of the semiconductor substrate 10 covered by the OC pad 22. The unit cells of the current sensing portion 12 are disposed adjacent to one another in a direction parallel to the front surface of the semiconductor substrate 10. The direction along which the unit cells of the current sensing portion 12 are adjacent to one another, for example, is a same direction as that along which the unit cells of the main semiconductor device element 11 are adjacent to one another. The unit cells of the current sensing portion 12 are connected in parallel to one another by the OC pad 22.

Further, in the region of the semiconductor substrate 10 covered by the OC pad 22, a region thereof excluding the sensing effective region 12a, is a sensing non-operating region 12b that does not function as the current sensing portion 12. The sensing non-operating region 12b is free of the unit cells of the current sensing portion 12. In substantially an entire area of the main non-operating region 1b excluding the sensing effective region 12a, a p-type base region 34b described hereinafter (refer to FIGS. 2 and 3) extends in a surface region of the semiconductor substrate 10 at the front surface thereof, from the sensing effective region 12a.

The temperature sensing portion 13 has a function of detecting a temperature of the main semiconductor device element 11 (the semiconductor substrate 10), using diode temperature characteristics. The temperature sensing portion 13 is disposed directly beneath the anode pad 23a and the cathode pad 23b. The temperature sensing portion 13, for example, may be a polysilicon diode configured by a polysilicon (poly-Si) layer provided on an interlayer insulating film 40 on the front surface of the semiconductor substrate 10, or may be a diffusion diode formed by pn junctions between p-type regions and n-type regions formed in the semiconductor substrate 10.

The overcurrent protecting portion (not depicted), for example, is a diode that protects the main semiconductor device element 11 from overvoltage (OV) such as surges. The current sensing portion 12, the temperature sensing portion 13, and the overcurrent protecting portion are controlled by the arithmetic circuit portion. The arithmetic circuit portion controls the main semiconductor device element 11 based on output signals from the current sensing portion 12, the temperature sensing portion 13, and the overcurrent protecting portion. The arithmetic circuit portion is configured by multiple semiconductor device elements such as Complementary MOS (CMOS) circuits.

Figure 2:
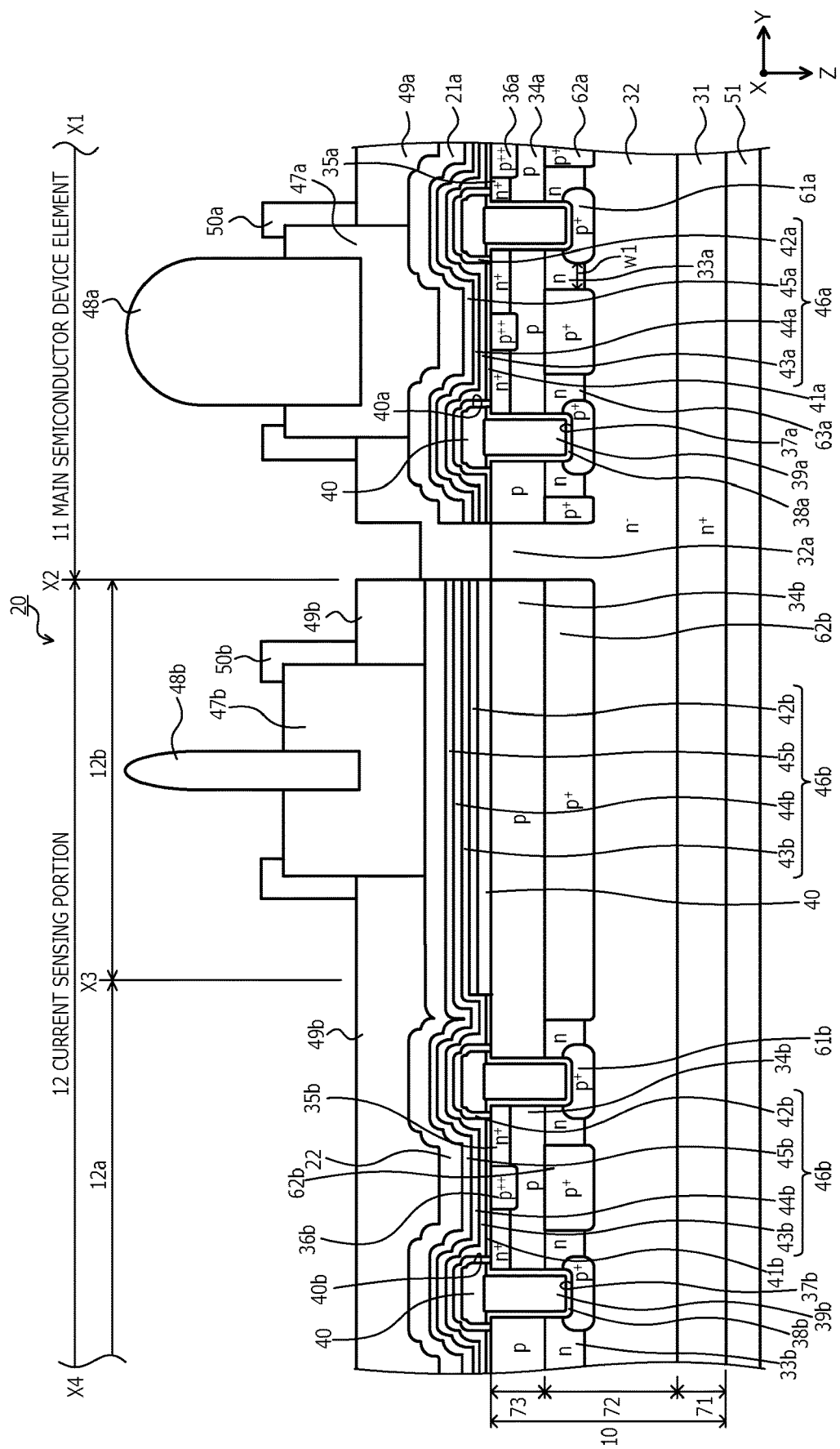
FIG. 2 is a cross-sectional view of an active region in FIG. 1.
Figure 3:
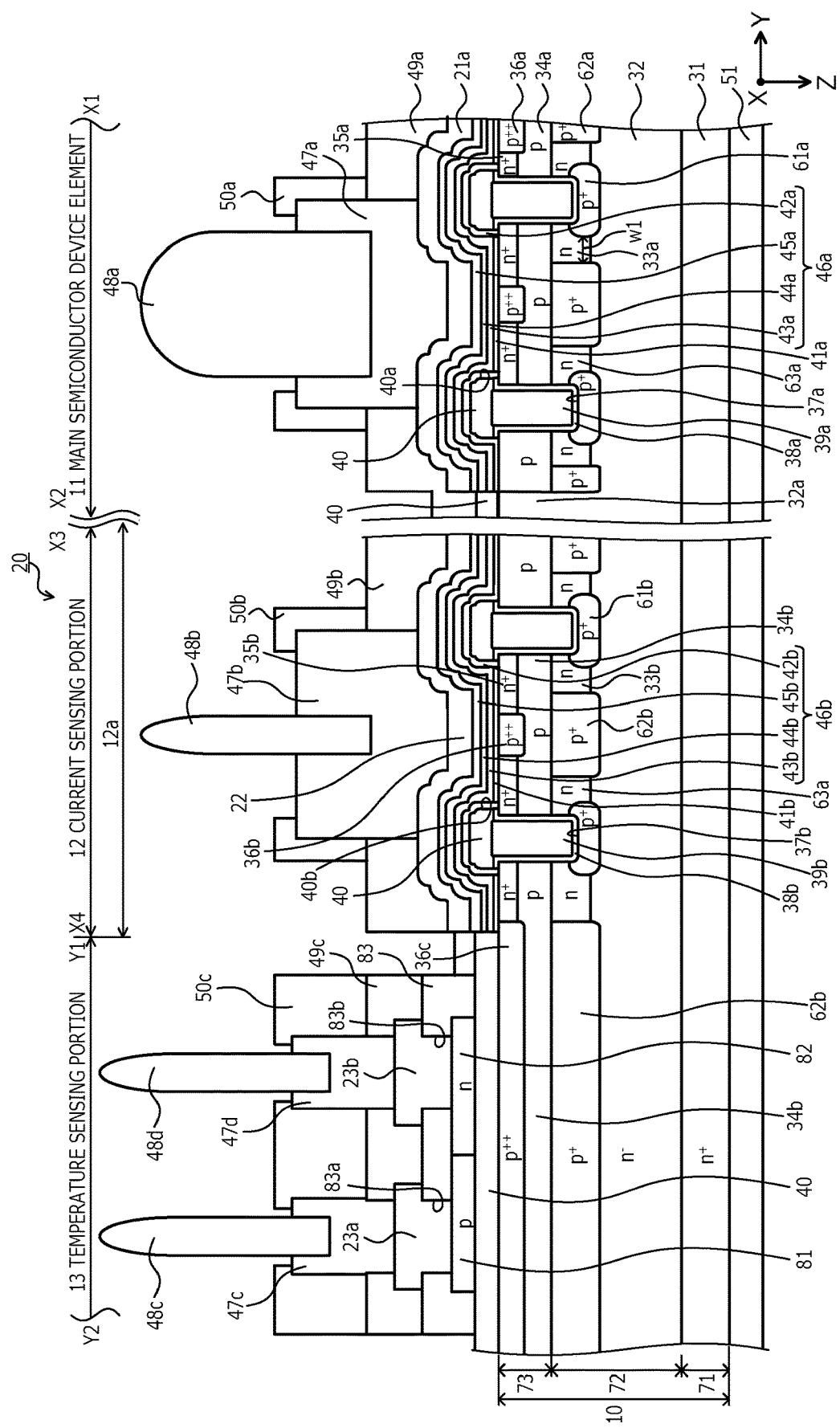
FIG. 3 is a cross-sectional view of the active region in FIG. 1.
Figure 5A:
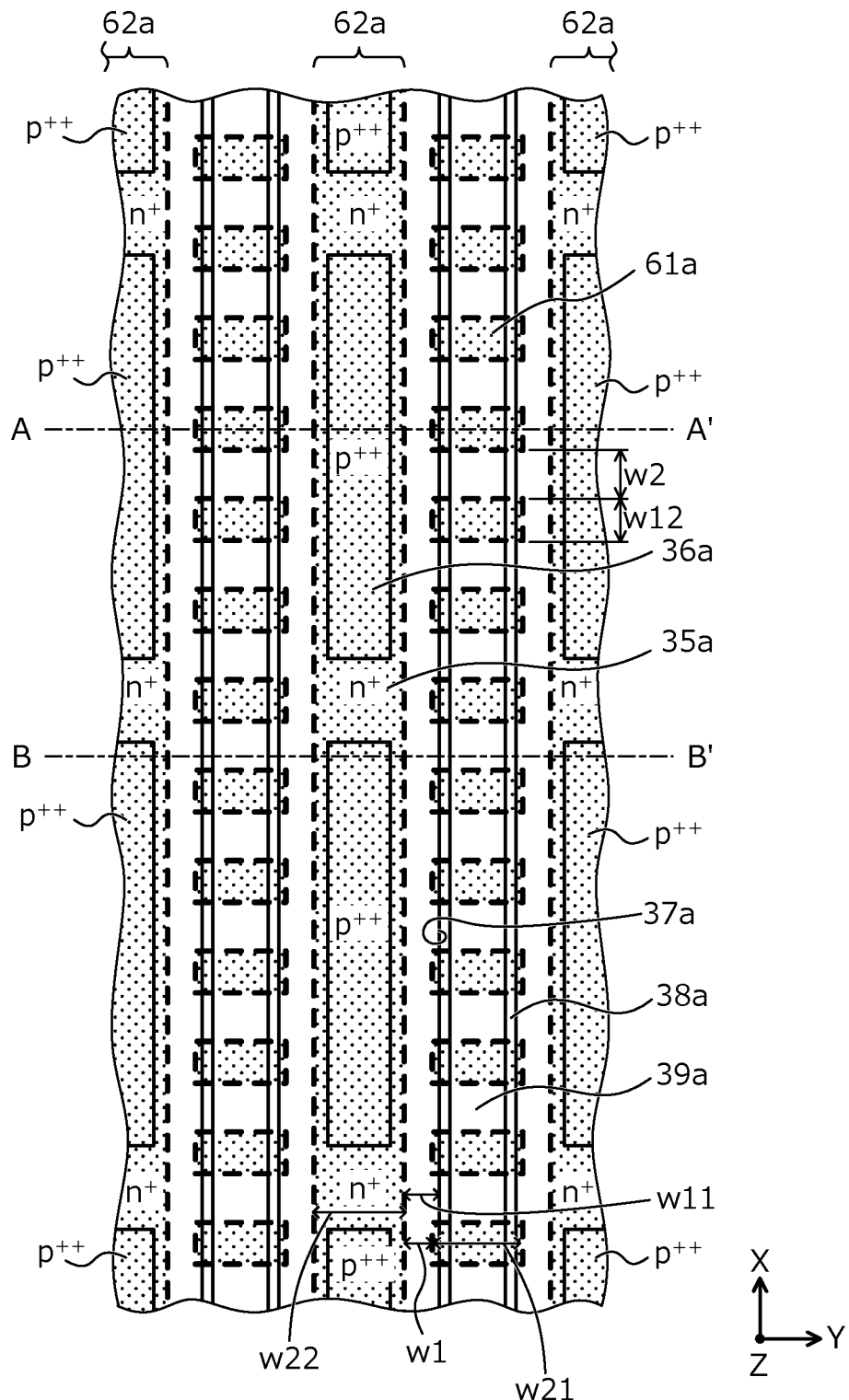
FIG. 5A is a plan view of a layout when a portion of the active region depicted in FIG. 1 is viewed from the front side of the semiconductor substrate.
Figure 5B:
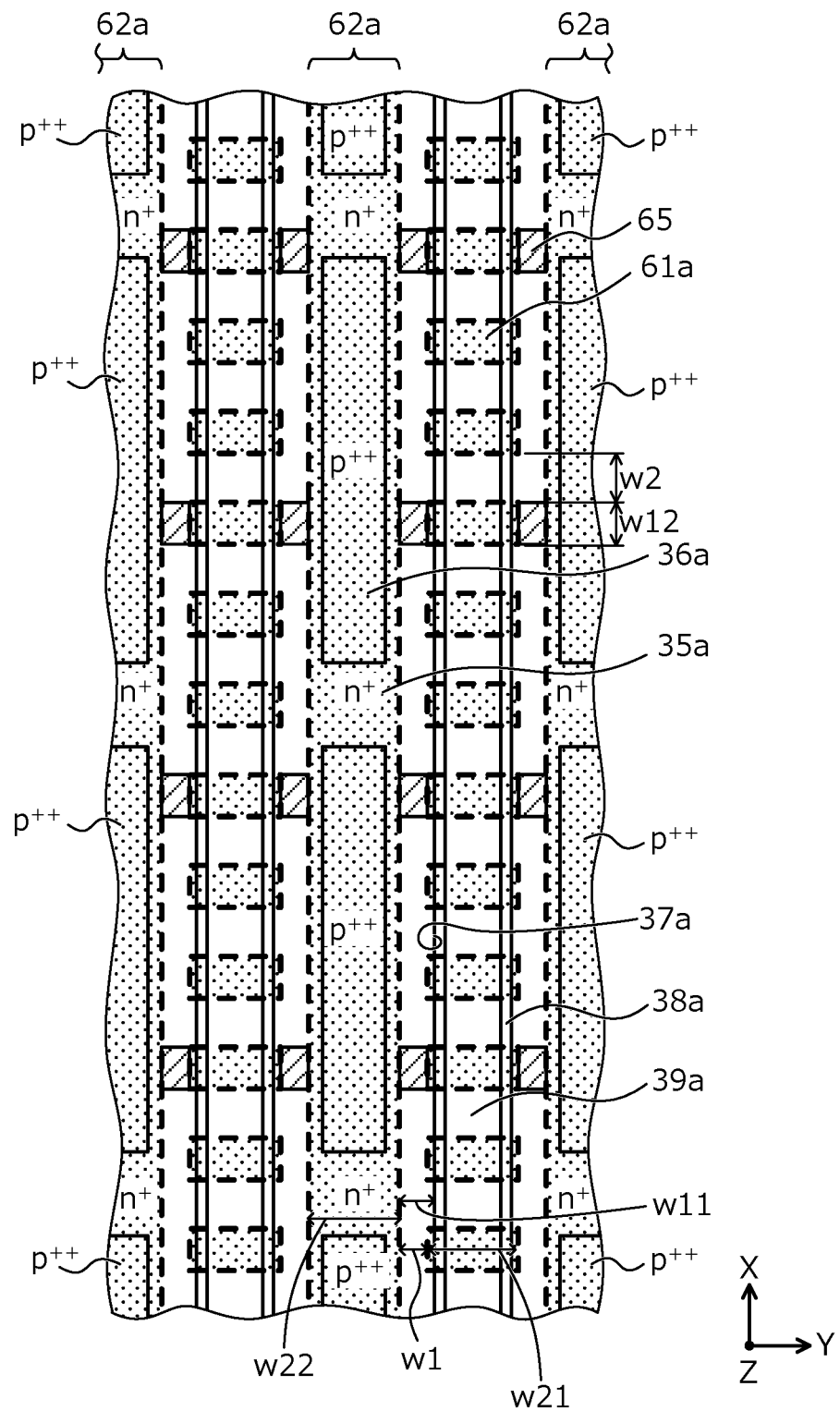
FIG. 5B is a plan view of another example of layouts when a portion of the active region depicted in FIG. 1 is viewed from the front side of the semiconductor substrate.
Figure 5C:
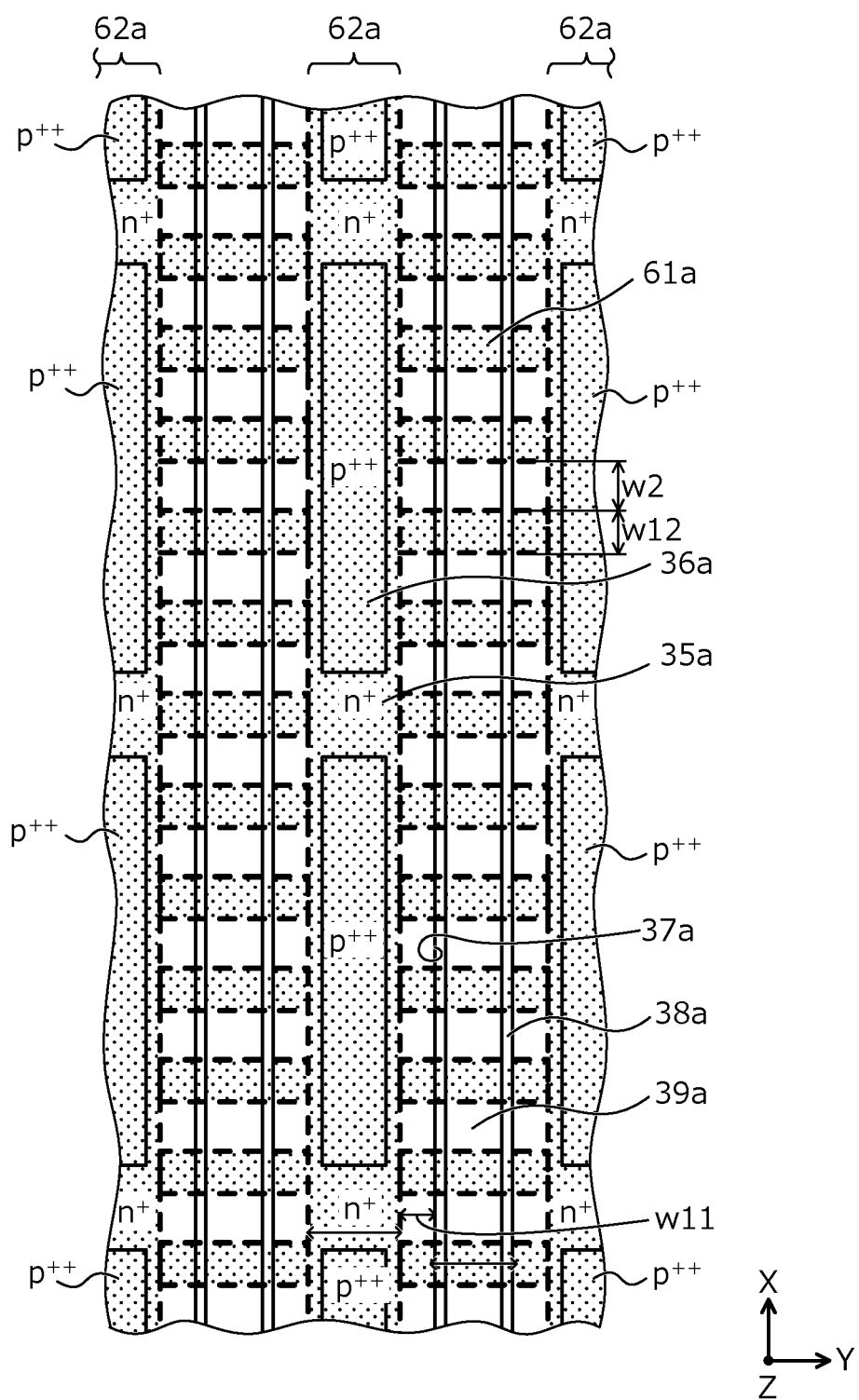
FIG. 5C is a plan view of another example of layouts when a portion of the active region depicted in FIG. 1 is viewed from the front side of the semiconductor substrate.

A cross-sectional view of the structure of the semiconductor device 20 according to the embodiment is described. FIGS. 2, 3, and 4 are cross-sectional views of the active region in FIG. 1. FIG. 5A is a plan view of a layout when a portion of the active region depicted in FIG. 1 is viewed from the front side of the semiconductor substrate. FIGS. 5B and 5C are plan views of other examples of layouts when a portion of the active region depicted in FIG. 1 is viewed from the front side of the semiconductor substrate. FIG. 2 depicts a cross-sectional view of the structure of the main effective region 1a and the current sensing portion 12 (cross-section view of the structure along cutting line X1-X2-X3-X4 in FIG. 1). FIG. 3 depicts a cross-sectional view of the structure of the main effective region 1a, the sensing effective region 12a, and the temperature sensing portion 13 (cross-sectional view of the structure along cutting line X1-X2, cutting line X3-X4, and cutting line Y1-Y2 in FIG. 1).

In FIGS. 2 and 3, a portion of the respective unit cells of the main effective region 1a and the sensing effective region 12a are depicted. The cross-sectional views of the structure of the main effective region 1a in FIGS. 2 and 3 correspond to cross-sectional views of the structure along cutting line A-A' in FIG. 5A. In FIGS. 2 and 3, the unit cell furthest in a second direction Y of the main effective region 1a is depicted and configuration is such that outside a trench 37a of an outermost periphery that is an outer peripheral portion of the main effective region 1a, no n$^+$-type source region 35a is provided. Further, as depicted in FIG. 5A, in a cross-section of the structure in the main effective region 1a, all trenches 37a adjacent to one another have an n$^+$-type source region 35a therebetween.

FIG. 4 depicts a cross-sectional view of the structure along cutting line B-B' in FIG. 5A. FIGS. 5A, 5B, and 5C depict layouts of first p$^+$-type regions 61a (first high-concentration regions, hatched portions surrounded by dashed lines) and second p$^+$-type regions 62a (second high-concentration regions, hatched portions between vertical dashed lines) that mitigate electric field applied to bottoms of the trenches 37a of the main semiconductor device element 11. In FIGS. 5A, 5B, and 5C, to clearly depict arrangement of the first and the second p$^+$-type regions 61a, 62a in a plan view thereof, parts other than the first and the second p$^+$-type regions 61a, 62a such as the n$^+$-type source regions 35a, p$^{++}$-type contact regions 36a, and the trenches 37a are not depicted.

In the semiconductor substrate 10 at the front surface thereof in the main effective region 1a, the main semiconductor device element 11 has MOS gates (insulated gates having a 3-layer structure including a metal, an oxide film, and a semiconductor) having a trench gate structure, configured by p-type base regions 34a, the n$^+$-type source regions 35a, the p$^{++}$-type contact regions 36a, the trenches 37a, gate insulating films 38a, and gate electrodes 39a. The semiconductor substrate 10 is formed by sequentially forming by epitaxial growth on a front surface of an n$^+$-type starting substrate 71 containing silicon carbide, silicon carbide layers 72, 73 that form an n$^-$-type drift region (first semiconductor region) 32 and the p-type base regions (second semiconductor regions) 34a.

The n$^+$-type starting substrate 71 forms an n$^+$-type drain region 31 of the main semiconductor device element 11 and the current sensing portion 12. A first main surface of the semiconductor substrate 10 on a side thereof having the p-type silicon carbide layer 73 is the front surface and a second main surface of the semiconductor substrate 10 on a side thereof having the n$^+$-type starting substrate 71 (back surface of the n$^+$-type starting substrate 71) is a back surface. Here, while an instance in which the main semiconductor device element 11 and the circuit portions that protect and control the main semiconductor device element 11 have wiring structures configured similarly to one another using pin-shaped wiring members (terminal pins 48a, 48b, 48c, 48d described hereinafter), a wiring structure using wire instead of the pin-shaped wiring members may be adopted.

The trenches 37a penetrate through the p-type silicon carbide layer 73 from the front surface of the semiconductor substrate 10 in the depth direction Z and reach the n$^-$-type silicon carbide layer 72. The trenches 37a are disposed in a striped pattern extending in a direction (herein, the first direction X) parallel to the front surface of the semiconductor substrate 10. A width of the trenches 37a in a lateral direction (herein, the second direction Y), for example, is about 1.0 μm. In the trenches 37a, the gate electrodes 39a are provided via the gate insulating films 38a, respectively. The gate electrodes 39a extend in a linear shape in the trenches 37a, in the first direction X along which the trenches 37a extend.

Between adjacent trenches 37a of the trenches 37a, the p-type base regions 34a, the n$^+$-type source regions (third semiconductor regions) 35a, and the p$^{++}$-type contact regions 36a are selectively provided in surface regions of the semiconductor substrate 10 at the front surface thereof. Between the front surface of the semiconductor substrate 10 and the p-type base regions 34a, the n$^+$-type source regions 35a and the p$^{++}$-type contact regions 36a are selectively provided in contact with the p-type base regions 34a. The n$^+$-type source regions 35a and the p$^{++}$-type contact regions 36a are exposed at the front surface of the semiconductor substrate 10.

The n$^+$-type source regions 35a and the p$^{++}$-type contact regions 36a being exposed at the front surface of the semiconductor substrate 10 means the n$^+$-type source regions 35a and the p$^{++}$-type contact regions 36a are in contact with later-described NiSi films 41a in later-described first contact holes 40a of the later-described interlayer insulating film 40. The n$^+$-type source regions 35a and the p$^{++}$-type contact regions 36a are disposed between adjacent trenches 37a of the trenches 37a to repeatedly alternate one another in the first direction X, which is the direction in which the gate electrodes 39a extend.

The n$^+$-type source regions 35a are in contact with the gate insulating films 38a at sidewalls of the trenches 37a; the p$^{++}$-type contact regions 36a, at positions separate from the trenches 37a, are in contact with the n$^+$-type source regions 35a. The n$^+$-type source regions 35a, between adjacent trenches 37a of the trenches 37a, form a ladder-like shape surrounding peripheries of the p$^{++}$-type contact regions 36a in a plan view thereof. Therefore, each of the n$^+$-type source regions 35a has portions that extend in the first direction X along the sidewalls of the trenches 37a and a portion that is sandwiched between the p$^{++}$-type contact regions 36a that are adjacent to each other in the first direction X.

The p$^{++}$-type contact regions 36a may be omitted. In this instance, instead of the p$^{++}$-type contact regions 36a, the p-type base regions 34a reach the front surface of the semiconductor substrate 10 and are exposed, peripheries of surface regions of the p-type base regions 34a exposed at the front surface of the semiconductor substrate 10 are surrounded by the n$^+$-type source regions 35a. In the semiconductor substrate 10, the n$^-$-type drift region 32 is provided between the n$^+$-type drain region 31 (the n$^+$-type starting substrate 71) and the p-type base regions 34a, in contact with the p-type base regions 34a and the n$^+$-type drain region 31.

Between the n$^-$-type drift region 32 and the p-type base regions 34a, n-type current spreading regions 33a may be provided in contact with said regions. The n-type current spreading regions 33a are a so-called current spreading layer (CSL) that reduces carrier spreading resistance. Further, in the semiconductor substrate 10, at positions closer to the n$^+$-type drain region 31 than are the bottoms of the trenches 37a, the first and the second p$^+$-type regions 61a, 62a that mitigate electric field applied to the bottoms of the trenches 37a are provided.

The first and the second p$^+$-type regions 61a, 62a may terminate in the n-type current spreading regions 33a and peripheries thereof may be surrounded by the n-type current spreading regions 33a (not depicted). The first and the second p$^+$-type regions 61a, 62a may terminate at the same positions as the n-type current spreading regions 33a on a drain side and may be in contact with the n$^-$-type drift region 32 (not depicted). Alternatively, the first and the second p$^+$-type regions 61a, 62a may extend further on the drain side than do the n-type current spreading regions 33a and may terminate in the n$^-$-type drift region 32 (refer to FIGS. 2 to 4). In other words, the n-type current spreading regions 33a may be formed deeper or shallower than the first and the second p$^+$-type regions 61a, 62a.

The first p$^+$-type regions 61a are provided separate from the p-type base regions 34a and face the trenches 37a in the depth direction Z. The first p$^+$-type regions 61a may or may not be in contact with the bottoms of the trenches 37a. The first p$^+$-type regions 61a are scattered in the first direction X, which is the direction in which the gate electrodes 39a extend (refer to FIG. 5A). At portions facing the bottoms of the trenches 37a in the depth direction Z, the first p$^+$-type regions 61a and the n-type current spreading regions 33a are disposed to repeatedly alternate one another in the first direction X. As a result, an effect of mitigating electric field at the bottoms of trenches 37a by the first p$^+$-type regions 61a and reduction of the ON resistance may be achieved.

The first p$^+$-type regions 61a, for example, have a substantially rectangular shape in a plan view thereof. An interval w2 between the first p$^+$-type regions 61a that are adjacent to each other in the first direction X, for example, is at most about 1.0 µm. A width (first length) w12 of the first p$^+$-type regions 61a in the first direction X, for example, is in a range from at least a processing limit value for ion implantation to at most about 1.0 µm, and preferably may be substantially a same dimension as the interval w2 between the first p$^+$-type regions 61a that are adjacent to each other in the first direction X. Further, the width w12 of the first p$^+$-type regions 61a in the first direction X, for example, may be narrower than a width (second length) w21 of the first p$^+$-type regions 61a in the second direction Y.

In this manner, arrangement and dimensions of the first p$^+$-type regions 61a are set, whereby a predetermined breakdown voltage and a predetermined low ON resistance may be achieved as described hereinafter (refer to FIG. 12). To sustain the predetermined breakdown voltage, the width w21 of the first p$^+$-type regions 61a in the second direction Y has to be at least a minimum of 50% of a width of the trenches 37a in a lateral direction and may be preferably set to be at least 100% thereof. Further, to reduce the ON resistance, the width w21 of the first p$^+$-type regions 61a in the second direction Y may be preferably at most 150% the width of the trenches 37a in the lateral direction. The widths w21, w22 of the first and the second p$^+$-type regions 61a, 62a in the second direction Y are substantially equal to each other. The widths being substantially equal to each other means the widths are equal within a range that includes an allowable error due to process variation.

The second p$^+$-type regions 62a are respectively disposed between adjacent trenches 37a of the trenches 37a, separate from the first p$^+$-type regions 61a and the trenches 37a, and in contact with the p-type base regions 34a. The second p$^+$-type regions 62a extend in a linear shape of a length substantially equal to that of the trenches 37a, in the first direction X, which is the direction in which the trenches 37a extend (refer to FIG. 5A). The second p$^+$-type regions 62a face the first p$^+$-type regions 61a in the second direction Y, across the n-type current spreading regions 33a and at portions not facing the first p$^+$-type regions 61a, face the trenches 37a, across the n-type current spreading regions 33a.

Therefore, at same depth positions as the first and the second p$^+$-type regions 61a, 62a, the n-type current spreading regions 33a each has a first portion 63a between one of the second p$^+$-type regions 62a and one of the first p$^+$-type regions 61a and a second portion 64a between one of the second p$^+$-type regions 62a and one the trenches 37a, the second portion 64a having a width w11 in the second direction Y wider than that of the first portion 63a (w11>w1). As a result, when the main semiconductor device element 11 is ON, JFET resistance of the main semiconductor device element 11 may be reduced a greater extent by the second portions 64a as compared to the first portions 63a of the n-type current spreading regions 33a.

Further, as described above, the second p$^+$-type regions 62a extend between adjacent trenches 37a of the trenches 37a, in the first direction X to a length substantially equal to that of the trenches 37a. Therefore, even when the first p$^+$-type regions 61a that face the bottoms of the trenches 37a are disposed partially reduced in number, in portions free of the first p$^+$-type regions 61a, the electric field applied to the bottoms of the trenches 37a may be mitigated by the second p$^+$-type regions 62a. As a result, application of high electric field to the bottoms of the trenches 37a may be suppressed.

In FIG. 5A, while all of the first p$^+$-type regions 61a have a floating potential, by electrical connection to the second p$^+$-type regions 62a, the first p$^+$-type regions 61a may be fixed at the potential of the source pad 21a. By fixing the first p+-type regions 61a to the potential of the source pad 21a, the electric field applied to the bottoms of the trenches 37a may be assuredly mitigated. Such modification examples are depicted in FIGS. 5B and 5C. For example, as depicted in FIG. 5B, p+-type regions 65 (portions hatched differently from the first and the second p+-type regions 61a, 62a) connecting adjacent first and second p+-type regions 61a, 62a of the first and the second p+-type regions 61a, 62a may be selectively provided. In FIG. 5B, configuration is such that the p+-type regions 65 that electrically connect the first p+-type regions 61a and the second p+-type regions 62a are provided every third one of the first p+-type regions 61a.

Further, as depicted in FIG. 5C, the first p+-type regions 61a may extend in the second direction Y, whereby ends of the first p+-type regions 61a are connected to the second p+-type regions 62a, and the first and the second p+-type regions 61a, 62a are disposed in a ladder-like shape. Such a configuration has an advantage in that a safe operation area is large. In this instance, all of the first p+-type regions 61a are fixed at the potential of the source pad 21a and therefore, the interval w2 between the first p+-type regions 61a that are adjacent to each other in the first direction X and a region that reduces the JFET resistance may both be wider as compared to those in an instance in which the first p+-type regions 61a have a floating potential (refer to FIG. 5A). The interval w2 between the first p+-type regions 61a that are adjacent to each other in the first direction X, for example, is in a range from about 0.5 μm to 1.5 μm.

The interlayer insulating film 40 is provided in substantially an entire area of the front surface of the semiconductor substrate 10 and covers the gate electrodes 39a in the main effective region 1a. The gate electrodes 39a of all of the unit cells are electrically connected to the gate pad 21b (refer to FIG. 1). In the main effective region 1a, the first contact holes 40a that penetrate through the interlayer insulating film 40 in the depth direction Z are provided. In the first contact holes 40a, the n+-type source regions 35a and the p++-type contact regions 36a are exposed.

In the first contact holes 40a, the nickel silicide (NiSi, Ni$_2$Si, or thermally stable NiSi$_2$, collectively "NiSi") films 41a are in ohmic contact with the semiconductor substrate 10 and are electrically connected to the n+-type source regions 35a and the p++-type contact regions 36a. In an instance in which the p++-type contact regions 36a are not provided, instead of the p++-type contact regions 36a, the p-type base regions 34a are exposed in the first contact holes 40a and are electrically connected to the NiSi films 41a.

In an entire area of the surface of the interlayer insulating film 40 and entire areas of the surfaces of the NiSi films 41a in the main effective region 1a, a barrier metal 46a is provided along the surfaces of the interlayer insulating film 40 and the NiSi films 41a. The barrier metal 46a has a function of preventing interaction between metal films of the barrier metal 46a and interaction between regions facing each other across the barrier metal 46a. The barrier metal 46a, for example, may have a layered structure in which a first titanium nitride (TiN) film 42a, a first titanium (Ti) film 43a, a second TiN film 44a, and a second Ti film 45a are sequentially stacked.

The first TiN film 42a covers an entire area of the surface of the interlayer insulating film 40. The first TiN film 42a is not provided on the front surface of the semiconductor substrate 10 in portions thereof where the NiSi films 41a is formed. The first Ti film 43a is provided on the surface of the first TiN film 42a and on the surfaces of the NiSi films 41a. The second TiN film 44a is provided on the surface of the first Ti film 43a. The second Ti film 45a is provided on the surface of the second TiN film 44a. The source pad 21a is provided in an entire area of the surface of the second Ti film 45a.

The source pad 21a is electrically connected to the n+-type source regions 35a and the p++-type contact regions 36a via the barrier metal 46a and the NiSi films 41a. The source pad 21a, for example, may be an aluminum (Al) film, an aluminum-silicon (Al—Si) film, or an aluminum-silicon-copper (Al—Si—Cu) film having a thickness of about 5 μm. The source pad 21a, the barrier metal 46a, and the NiSi films 41a function as a source electrode of the main semiconductor device element 11.

A first end of each of the terminal pins 48a is bonded on the source pad 21a, via plating films 47a and a solder layer (not depicted). A second end of each of the terminal pins 48a is bonded to a metal bar (not depicted) disposed so as to face the front surface of the semiconductor substrate 10. Further, the second end of each of the terminal pins 48a is exposed outside a case (not depicted) in which the semiconductor substrate 10 is mounted, the second ends being electrically connected to an external device (not depicted). The terminal pins 48a are soldered to the plating films 47a in a substantially upright state with respect to the front surface of the semiconductor substrate 10.

The terminal pins 48a are wiring members having a round, rod-like shape (cylinder shape) having a predetermined diameter and are connected to an external ground potential (minimum electric potential). The terminal pins 48a are external connection terminals that lead out the potential of the source pad 21a. First and second protective films 49a, 50a, for example, are polyimide films. Portions of the surface of the source pad 21a other than portions having the plating films 47a are covered by first protective films 49a. Borders between the plating films 47a and the first protective films 49a are covered by second protective films 50a.

A drain electrode 51 is in ohmic contact with an entire area of the back surface of the semiconductor substrate 10 (back surface of the n+-type starting substrate 71). On the drain electrode 51, a drain pad (electrode pad, not depicted) having a stacked structure in which, for example, a Ti film, a nickel (Ni) film, and a gold (Au) film are sequentially stacked is provided. The drain pad is soldered to a metal base plate (not depicted) of an insulated substrate, the metal plate being formed by, for example, a copper foil, and at least a portion of the drain pad is in contact with a base portion of a cooling fin (not depicted) via the metal base plate.

In this manner, the terminal pins 48a are bonded to the source pad 21a on the front surface of the semiconductor substrate 10 and the drain pad of the back surface is bonded to the metal base plate of the insulated substrate, whereby a double-sided cooling structure in which a cooling structure is provided on both sides of the semiconductor substrate 10 is formed. Heat generated by the semiconductor substrate 10 is radiated from a fin portion of the cooling fin via the metal base plate bonded to the drain pad at the back surface of the semiconductor substrate 10 and is radiated from the metal bar to which the terminal pins 48a of the front surface of the semiconductor substrate 10 are bonded.

The current sensing portion 12 includes the p-type base region 34b, n+-type source regions 35b, p++-type contact regions 36b, trenches 37b, gate insulating films 38b, gate electrodes 39b, and the interlayer insulating film 40 respectively having configurations similar to configurations of corresponding parts of the main semiconductor element 11. Parts of the MOS gates of the current sensing portion 12 are provided in the sensing effective region 12a of the main non-operating region 1b. The p-type base region 34b is apart from the p-type base regions 34a of the main semiconductor device element 11 with an n⁻-type region 32a of the semiconductor substrate 10 at the front surface thereof intervening therebetween.

The p-type base region 34b, for example, extends in substantially an entire area of the main non-operating region 1b, from the sensing effective region 12a. The current sensing portion 12 may have the n-type current spreading regions 33b and first and second p⁺-type regions 61b, 62b. In this instance, the n-type current spreading regions 33b and the second p⁺-type regions 62b are disposed similarly as corresponding regions in the main semiconductor device element 11. The first p⁺-type regions 61b may be scattered in the first direction X similarly as corresponding regions in the main semiconductor device element 11 or may extend in a linear shape in the first direction X like those in a conventional structure (refer to reference numeral 261 in FIG. 14).

In an instance in which the first p⁺-type regions 61b are scattered in the first direction X, arrangement and dimensions of the first p⁺-type regions 61b may be similar to those in the main semiconductor device element 11. The p⁺⁺-type contact regions 36b may be omitted. In this instance, similarly to the main semiconductor device element 11, instead of the p⁺⁺-type contact regions 36b, the p-type base region 34b is exposed at the front surface of the semiconductor substrate 10. The gate electrodes 39b of all of the unit cells are electrically connected to the gate pad 21b (refer to FIG. 1). The gate electrodes 39b are covered by the interlayer insulating film 40.

In the sensing effective region 12a, second contact holes 40b that penetrate through the interlayer insulating film 40 in the depth direction Z and reach the semiconductor substrate 10 are provided, whereby the n⁺-type source regions 35b and the p⁺⁺-type contact regions 36b are exposed. In the sensing effective region 12a, on the front surface of the semiconductor substrate 10, similarly to the main semiconductor device element 11, NiSi films 41b and a barrier metal 46b are provided. Reference characters 42b, 43b, 44b, and 45b are respectively a first TiN film, a first Ti film, a second TiN film, and a second Ti film that configure the barrier metal 46b.

In the second contact holes 40b, the NiSi films 41b are in ohmic contact with the semiconductor substrate 10 and are electrically connected to the n⁺-type source regions 35b and the p⁺⁺-type contact regions 36b. In an instance in which the p⁺⁺-type contact regions 36b are omitted, instead of the p⁺⁺-type contact regions 36b, the p-type base region 34b is exposed in the second contact holes 40b and electrically connected to the NiSi films 41b. The barrier metal 46b extends on the interlayer insulating film 40 in the sensing non-operating region 12b.

In an entire area of the surface of the barrier metal 46b, the OC pad 22 is provided separate from the source pad 21a. The OC pad 22 is electrically connected to the n⁺-type source regions 35b and the p-type base region 34b via the barrier metal 46b and the NiSi films 41b. The OC pad 22, for example, is formed concurrently with the source pad 21a, using a same material as that of the source pad 21a. The OC pad 22, the barrier metal 46b, and the NiSi films 41b function as a source electrode of the current sensing portion 12.

On the OC pad 22, the terminal pins 48b are bonded by a wiring structure similar to the wiring structure on the source pad 21a. The terminal pins 48b are wiring members having a round, rod-like shape (cylinder shape) having a diameter smaller than the diameter of the terminal pins 48a. The terminal pins 48b, for example, are external connection terminals that lead electric potential of the OC pad 22 out of the device and connect the OC pad 22 to a ground potential via an external resistor (not depicted). Reference characters 47b, 49b, and 50b are respectively plating films, first protective films, and second protective films configuring the wiring structure on the OC pad 22.

The p-type base regions 34a of the main effective region 1a and the p-type base region 34b of the sensing effective region 12a are separated from a p-type region (not depicted) for device element isolation, by a non-depicted n⁻-type region in a surface region of the semiconductor substrate 10. The p-type region for device isolation is provided in the edge termination region 2, in a substantially rectangular shape surrounding a periphery of the active region and is a floating p-type region that forms a pn junction with the n⁻-type drift region 32 and thereby, forms parasitic diode electrically isolating the active region 1 and the edge termination region 2.

The temperature sensing portion 13, for example, is a polysilicon diode formed by a pn junction between a p-type polysilicon layer 81 that is a p-type anode region and an n-type polysilicon layer 82 that is an n-type cathode region (FIG. 3). The p-type polysilicon layer 81 and the n-type polysilicon layer 82 are provided on the interlayer insulating film 40, in the main non-operating region 1b. The temperature sensing portion 13 is electrically insulated from the semiconductor substrate 10, the main semiconductor device element 11, and the current sensing portion 12 by the interlayer insulating film 40.

The anode pad 23a and the cathode pad 23b are respectively in contact with the p-type polysilicon layer 81 and the n-type polysilicon layer 82 in third and fourth contact holes 83a, 83b of an interlayer insulating film 83 covering the anode pad 23a and the cathode pad 23b. The anode pad 23a and the cathode pad 23b, for example, are formed concurrently with the source pad 21a, using a same material as that of the source pad 21a. On the anode pad 23a and on the cathode pad 23b, the terminal pins 48c, 48d are respectively bonded by a wiring structure similar to the wiring structure on the source pad 21a.

The terminal pins 48c, 48d are external connection terminals that lead out potential of the anode pad 23a and the cathode pad 23b, respectively, and are wiring members having a round, rod-like shape having a predetermined diameter corresponding to the current capability of the temperature sensing portion 13. Reference characters 47c and 47d are plating films forming the wiring structure on the anode pad 23a and the wiring structure on the cathode pad 23b, respectively. Reference characters 49c and 50c are respectively first and second protective films configuring the wiring structure on the temperature sensing portion 13. In the temperature sensing portion 13, the barrier metal is not provided.

Further, in the main non-operating region 1b, a gate pad portion 14 is provided in which the gate pad 21b of the main semiconductor device element 11 is disposed (refer to FIG. 1). The gate pad 21b is provided on the interlayer insulating film 40 in the main non-operating region 1b, separate from the other electrode pads. The gate pad 21b, for example, is formed concurrently with the source pad 21a using a same material as that of the source pad 21a. On the gate pad 21b, terminal pins (not depicted) are bonded by a wiring structure similar to the wiring structure on the source pad 21a.

Operation of the semiconductor device 20 according to the embodiment is described. In a state in which voltage (forward voltage) that is positive with respect to the source electrode (the source pad 21a) of the main semiconductor device element 11 is applied to the drain electrode 51, when voltage at least equal to a gate threshold voltage is applied to the gate electrodes 39a of the main semiconductor device element 11, a channel (n-type inversion layer) is formed in the p-type base regions 34a of the main semiconductor device element 11, in portions thereof along the trenches 37a. As a result, current flows through the channel, from the $n^+$-type drain region 31 of the main semiconductor device element 11, toward the $n^+$-type source regions 35a, and the main semiconductor device element 11 turns ON.

The first and the second portions 63a, 64a (JFET region) of the n-type current spreading regions 33a become a path of the current that flows through the channel when the main semiconductor device element 11 is ON. When the main semiconductor device element 11 is ON, a depletion layer spreads from pn junctions between the first and the second $p^+$-type regions 61a, 62a and the n-type current spreading regions 33a, to the first and the second portions 63a, 64a of the n-type current spreading regions 33a, however, in each of the n-type current spreading regions 33a, portions thereof (portions of the n-type current spreading region 33a in which the depletion layer does not spread) that are current paths may be left wider by the second portions 64a than the first portions 63a.

A reason for this is that, in regions free of the first $p^+$-type regions 61a, the width w11 of the first or the second portions 63a, 64a (the second portions 64a) of the n-type current spreading regions 33a in the second direction Y is wide. The region through which the current passes becomes wider by the amount by which the width w11 of the second portions 64a of the n-type current spreading regions 33a in the second direction Y is wider and therefore, the flow of the current through the second portions 64a of the n-type current spreading regions 33a is facilitated. Furthermore, accompanying size reductions of the unit cells of the main semiconductor device element 11, even when a width between one of the first $p^+$-type regions 61a and one of the second $p^+$-type regions 62a adjacent thereto (a width w1 of the first portions 63a of the n-type current spreading regions 33a in the second direction Y) decreases to a processing limit (for example, about 0.2 µm), the JFET resistance of the main semiconductor device element 11 may be reduced. Further, the interval w2 between the first $p^+$-type regions 61a that are adjacent to each other in the first direction X is kept within 1.0 µm and therefore, positive holes do not reach the gate insulating films 38a during switching. Thus, the ability to mitigate electric field applied to the bottoms of the trenches 37a may be maintained.

In a state in which voltage (forward voltage) that is positive with respect to the source electrode (the OC pad 22) of the current sensing portion 12 is applied to the drain electrode 51 under conditions similar to those of the main semiconductor device element 11, when voltage at least equal to the gate threshold voltage is applied to the gate electrodes 39b of the current sensing portion 12, a channel (n-type inversion layer) is formed in the p-type base region 34b of the current sensing portion 12, in portions thereof along the trenches 37b. As a result, current flows from the $n^+$-type drain region 31 of the current sensing portion 12, toward the $n^+$-type source regions 35b (hereinafter, sensing current), and the current sensing portion 12 turns ON.

When the main semiconductor device element 11 is ON, the current sensing portion 12 is assumed to be ON. Due to the flow of the sensing current in the current sensing portion 12, voltage drop occurs at a resistor (not depicted) connected between a grounding point and the $n^+$-type source regions 35b of the current sensing portion 12. The sensing current of the current sensing portion 12 increases according to the magnitude of the current flowing in the main semiconductor device element 11 and therefore, the voltage drop at the resistor also increases. Thus, by monitoring the magnitude of the voltage drop at the resistor, overcurrent in the main semiconductor device element 11 may be detected.

On the other hand, when voltage less than the gate threshold voltage is applied to the gate electrodes 39a, the main semiconductor device element 11 remains in an OFF state due to reverse bias of the pn junctions between the first and the second $p^+$-type regions 61a, 62a, the p-type base regions 34a, the n-type current spreading regions 33a, and the $n^-$-type drift region 32. When voltage less than the gate threshold voltage is applied to the gate electrodes 39b of the current sensing portion 12, the current sensing portion 12 remains in an OFF state due to reverse bias of the pn junctions between the first and the second $p^+$-type regions 61b, 62b, the p-type base region 34b, the n-type current spreading regions 33b, and the $n^-$-type drift region 32.

The pn junctions between the first and the second $p^+$-type regions 61a, 62a, the n-type current spreading regions 33a, and the $n^-$-type drift region 32 are positioned closer to the drain electrode 51 than are the bottoms of the trenches 37a, whereby electric field applied to the bottoms of the trenches 37a when the main semiconductor device element 11 is OFF is mitigated. The pn junctions between the first and the second $p^+$-type regions 61b, 62b, the n-type current spreading regions 33b, and the $n^-$-type drift region 32 are positioned closer to the drain electrode 51 than are the bottoms of the trenches 37a, whereby electric field applied to the bottoms of the trenches 37b when the current sensing portion 12 is OFF is mitigated.

Further, when the main semiconductor device element 11 is OFF, an application of voltage that is negative with respect to the source electrode (the source pad 21a) to the drain electrode 51 enables the flow of current in a forward direction in a parasitic diode formed by the pn junctions between the first and the second $p^+$-type regions 61a, 62a, the n-type current spreading regions 33a, and the $n^-$-type drift region 32. For example, this parasitic diode built into the semiconductor substrate 10 may be used as a freewheeling diode for protecting the main semiconductor device element 11 itself.

During operation of the main semiconductor device element 11, in the temperature sensing portion 13, normally, forward current flows continuously from the anode pad 23a, through a pn junction between an anode region (the p-type polysilicon layer 81) and a cathode region (the n-type polysilicon layer 82), to the cathode pad 23b. A curve indicating a relationship between forward current If and forward voltage Vf of the temperature sensing portion 13 (forward voltage characteristics) is dependent on temperature and the higher the temperature becomes, the smaller the forward voltage Vf becomes. Thus, forward voltage characteristics of the temperature sensing portion 13 are obtained in advance and, for example, are stored in a storage unit (not depicted).

During operation of the main semiconductor device element 11, for example, the forward voltage Vf (voltage drop in the temperature sensing portion 13) occurring between the anode pad 23a and the cathode pad 23b of the temperature sensing portion 13 at room temperature (for example, 25 degrees C.) is continuously monitored by the arithmetic circuit portion. When the forward voltage Vf of the temperature sensing portion 13 decreases and a portion having a high temperature occurs in the main semiconductor device element 11 (the semiconductor substrate 10), the arithmetic circuit portion suspends a supply of gate voltage to the main semiconductor device element 11 and operation of the main semiconductor device element 11.

Next, a method of manufacturing the semiconductor device 20 according to the embodiment is described. FIGS. 6, 7, 8, 9, 10, and 11 are cross-sectional views depicting states of the structure of the semiconductor device according to the embodiment during manufacture. In FIGS. 6 to 11, while only cross-sectional views depicting states of the structure of the main semiconductor device element 11 along cutting line A-A' in FIG. 5A are depicted, parts of the semiconductor device elements (refer to FIGS. 1 to 3) fabricated on the single semiconductor substrate 10 are formed concurrently with parts of the main semiconductor device element 11 having the same impurity concentration and depth thereof.

Figure 6:
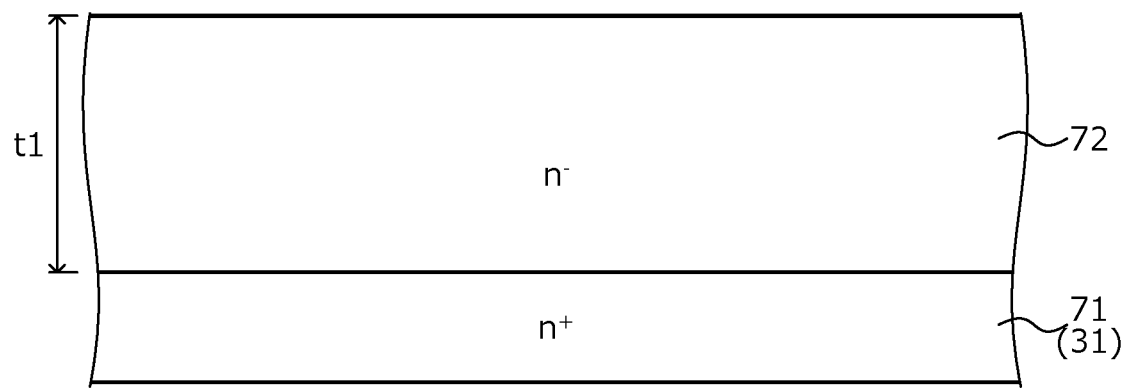
FIG. 6 is a cross-sectional view depicting a state of the structure of a semiconductor device according to the embodiment during manufacture.

First, as depicted in FIG. 6, for example, a silicon carbide single crystal substrate doped with nitrogen (N) is prepared as the $n^+$-type starting substrate (semiconductor wafer) 71 containing silicon carbide. Next, the $n^-$-type silicon carbide layer 72 doped with a lower concentration of nitrogen than is the $n^+$-type starting substrate 71 is epitaxially grown on the front surface of the $n^+$-type starting substrate 71. In an instance in which the main semiconductor device element 11 has a breakdown voltage of 3300V, a thickness t1 of the $n^-$-type silicon carbide layer 72, for example, may be about 30 μm.

Figure 7:
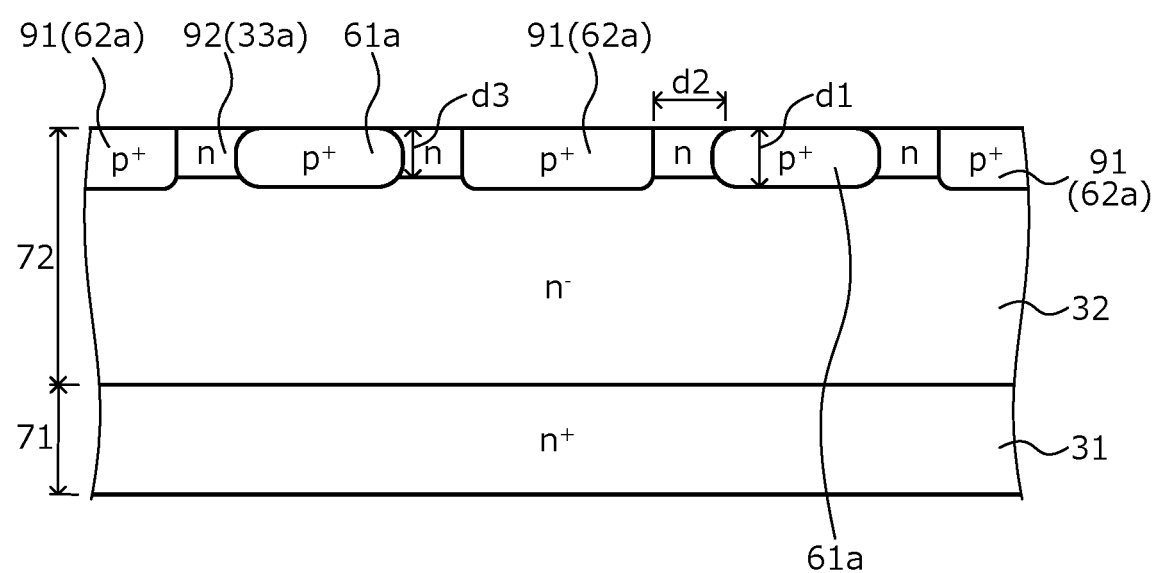
FIG. 7 is a cross-sectional view depicting a state of the structure of the semiconductor device according to the embodiment during manufacture.

Next, as depicted in FIG. 7, by photolithography and, for example, ion implantation of a p-type impurity such as Al, in the main effective region 1a, in the $n^-$-type silicon carbide layer 72 at a surface thereof, the first $p^+$-type regions 61a and $p^+$-type regions 91 are selectively formed. The first $p^+$-type regions 61a and the $p^+$-type regions 91 are disposed to repeatedly alternate one another in the second direction Y (refer to FIG. 5A). The first $p^+$-type regions 61a are disposed periodically at the predetermined interval w2, along the first direction X (refer to FIG. 5A).

Next, by photolithography and, for example, ion implantation of an n-type impurity such as nitrogen, in an entire area of the main effective region 1a, n-type regions 92 are formed in the $n^-$-type silicon carbide layer 72 at the surface thereof. The n-type regions 92 are formed between the first $p^+$-type regions 61a and the $p^+$-type regions 91, in contact with the $p^+$-type regions 61a, 91. A sequence in which the n-type regions 92 and the $p^+$-type regions 61a, 91 are formed may be interchanged.

A distance d2 between the $p^+$-type regions 61a, 91 that are adjacent to one another, for example, is about 1.5 μm. The $p^+$-type regions 61a, 91, for example, have a depth d1 of about 0.5 μm and an impurity concentration of about $5.0\times10^{18}/cm^3$. The n-type regions 92 have, for example, a depth d3 of about 0.4 μm and an impurity concentration of about $1.0\times10^{17}/cm^3$. Portions of the $n^-$-type silicon carbide layer 72 not ion implanted form the $n^-$-type drift region 32.

Figure 8:
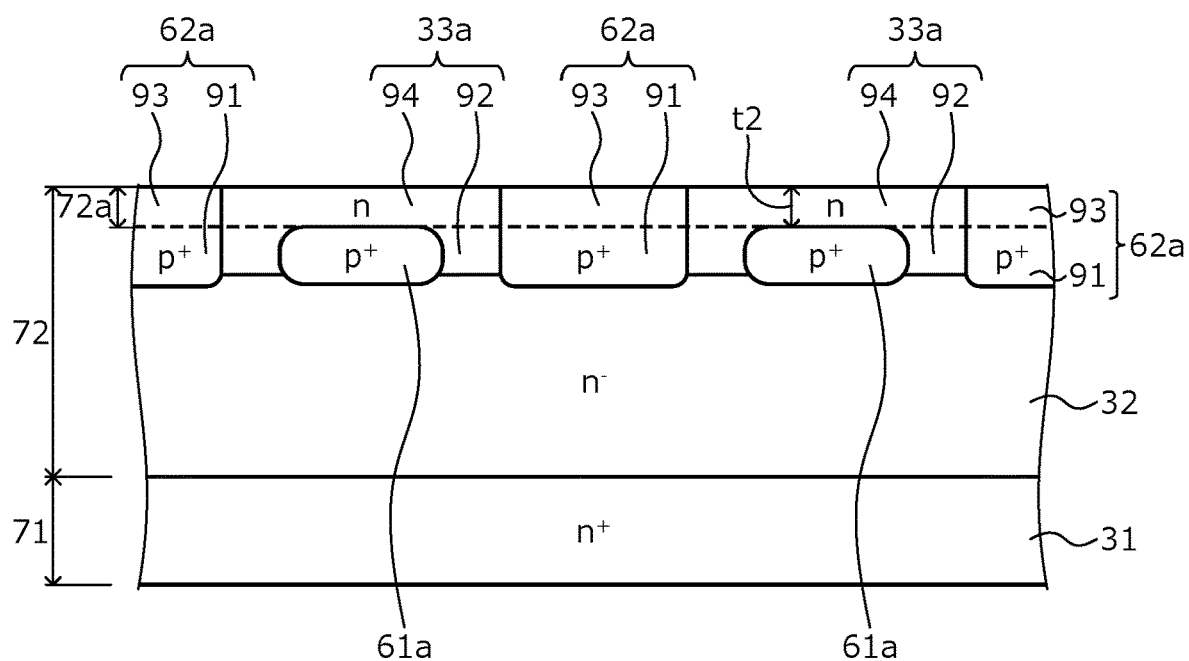
FIG. 8 is a cross-sectional view depicting a state of the structure of the semiconductor device according to the embodiment during manufacture.

Next, as depicted in FIG. 8, on the $n^-$-type silicon carbide layer 72, for example, an $n^-$-type silicon carbide layer doped with an n-type impurity such as nitrogen is further formed by epitaxial growth having, for example, a thickness t2 of about 0.5 μm, thereby increasing the thickness of the $n^-$-type silicon carbide layer 72. As a result, the thickness of the $n^-$-type silicon carbide layer 72 becomes a predetermined thickness. An impurity concentration of a portion 72a by which the thickness of the $n^-$-type silicon carbide layer 72 is increased may be, for example, $3\times10^{15}/cm^3$.

Next, by photolithography and ion implantation of a p-type impurity such as Al, in the portion 72a by which the thickness of the $n^-$-type silicon carbide layer 72 is increased, $p^+$-type regions 93 that reach the $p^+$-type regions 91 are selectively formed. Next, by photolithography and ion implantation of, for example, an n-type impurity such as nitrogen, n-type regions 94 that reach the n-type regions 92 are selectively formed in the portion 72a by which the thickness of the $n^-$-type silicon carbide layer 72 is increased.

As a result, the $p^+$-type regions 91, 93 that are adjacent to each other in the depth direction Z are connected, thereby forming the second $p^+$-type regions 62a. The n-type regions 92, 94 that are adjacent to each other in the depth direction Z are connected, thereby forming the n-type current spreading regions 33a. Conditions of the $p^+$-type regions 93 and the n-type regions 94 such as impurity concentrations, for example, are similar to those of the $p^+$-type regions 91 and the n-type regions 92, respectively. A sequence in which the $p^+$-type regions 93 and the n-type regions 94 are formed may be interchanged.

Figure 9:
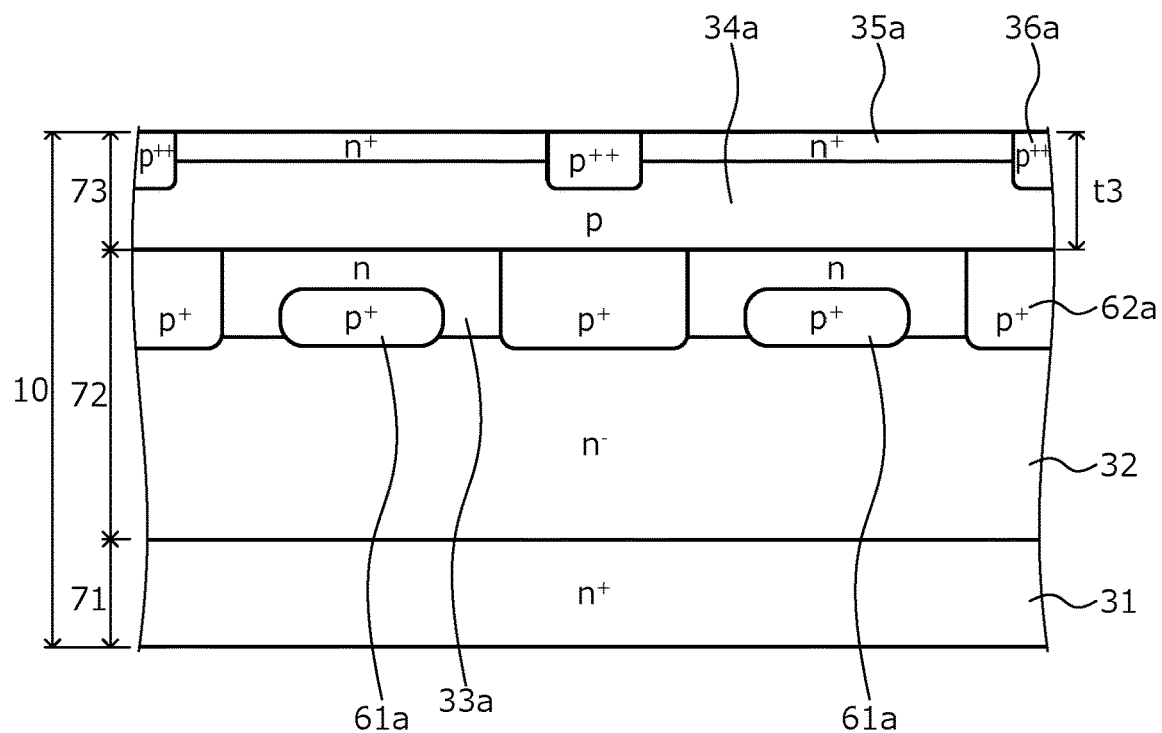
FIG. 9 is a cross-sectional view depicting a state of the structure of the semiconductor device according to the embodiment during manufacture.

Next, as depicted in FIG. 9, on the $n^-$-type silicon carbide layer 72, for example, the p-type silicon carbide layer 73 doped with a p-type impurity such as Al is epitaxially grown. The p-type silicon carbide layer 73, for example, has thickness t3 of about 1.3 μm and an impurity concentration of about $4.0\times10^{17}/cm^3$. By the processes up to here, the semiconductor substrate 10 (semiconductor wafer) in which the $n^-$-type silicon carbide layer 72 and the p-type silicon carbide layer 73 are sequentially stacked on the $n^+$-type starting substrate 71 is fabricated.

Next, a process including photolithography and ion implantation as a set is repeatedly performed under different conditions, thereby selectively forming in the main effective region 1a, the $n^+$-type source regions 35a and the $p^{++}$-type contact regions 36a in the p-type silicon carbide layer 73 at a surface thereof. In the main effective region 1a, portions of the p-type silicon carbide layer 73 between the type silicon carbide layer 72 and the $n^+$-type source regions 35a and the $p^{++}$-type contact regions 36a are the p-type base regions 34a.

Next, for diffused regions (the first and the second $p^+$-type regions 61a, 62a, the n-type current spreading regions 33a, the $n^+$-type source regions 35a, and the $p^{++}$-type contact regions 36a) formed by ion implantation, for example, impurity activation is performed by a heat treatment (activation annealing) at a temperature of about 1700 degrees C. for about 2 minutes. The activation annealing may be performed collectively once for all of the diffused regions or may be performed each time diffused regions are formed by ion implantation.

Figure 10:
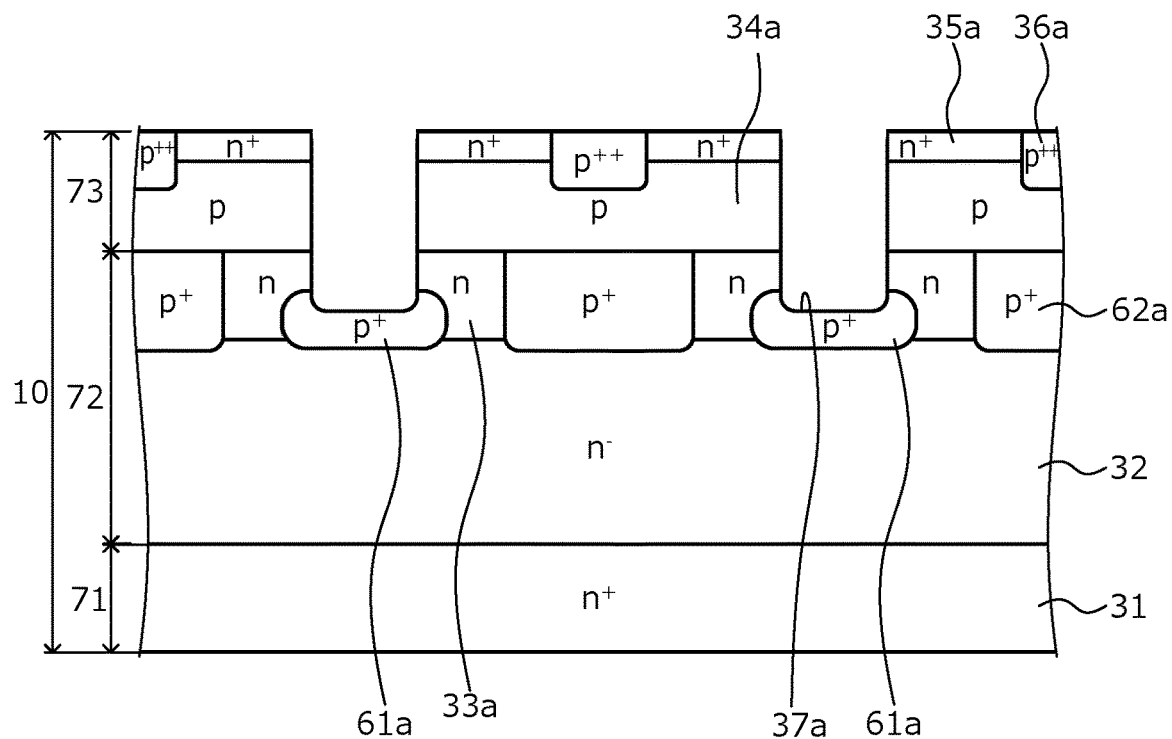
FIG. 10 is a cross-sectional view depicting a state of the structure of the semiconductor device according to the embodiment during manufacture.

Next, as depicted in FIG. 10, by photolithography and etching, the trenches 37a that penetrate through the $n^+$-type source regions 35a and the p-type base regions 34a from the front surface of the semiconductor substrate 10 to reach the n-type current spreading regions 33a and face the first $p^+$-type regions 61a in the depth direction Z (refer to FIGS. 2 and 3) are formed. The trenches 37a, for example, may reach the first $p^+$-type regions 61a and terminate in the first $p^+$-type regions 61a.

Figure 11:
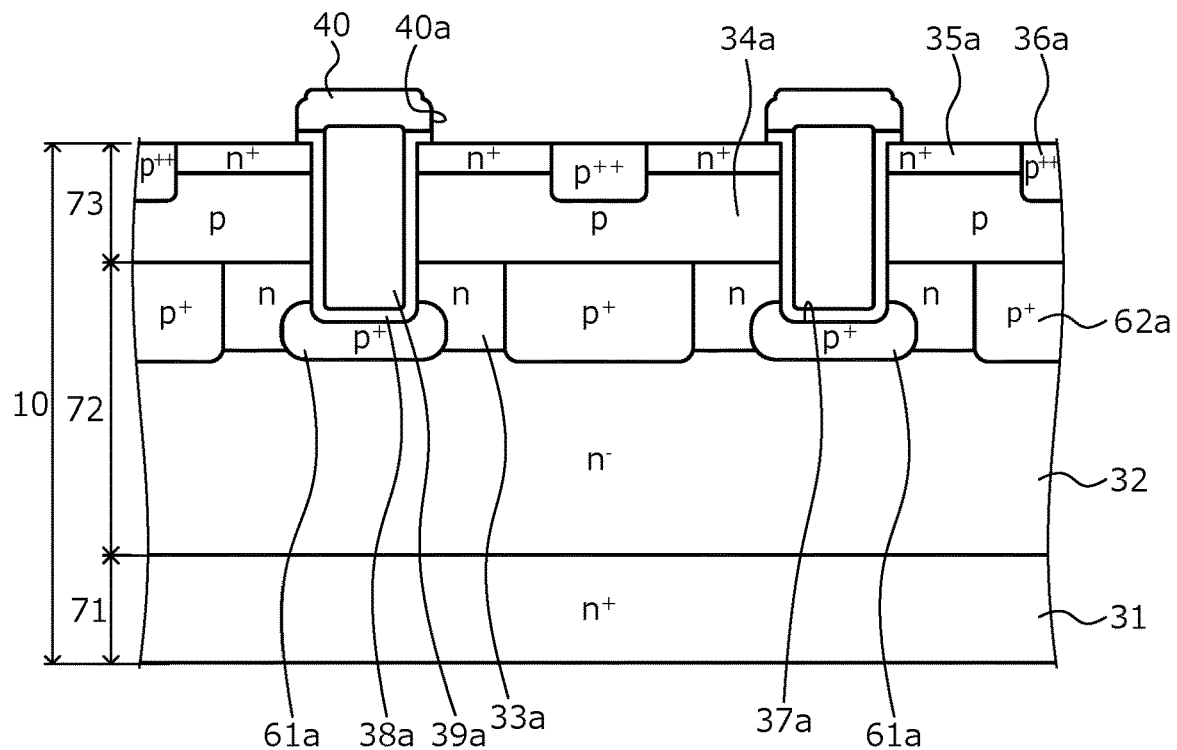
FIG. 11 is a cross-sectional view depicting a state of the structure of the semiconductor device according to the embodiment during manufacture.

Next, as depicted in FIG. 11, along the front surface of the semiconductor substrate 10 and inner walls of the trenches 37a, the gate insulating films 38a are formed. The gate insulating films 38a, for example, may be a thermal oxide film formed by thermally oxidizing a semiconductor surface under an oxygen ($O_2$) atmosphere at a temperature of about 1000 degrees C. or may be a deposited film such as a high temperature oxide (HTO).

Next, for example, a polysilicon layer doped with phosphorus (P) is deposited (formed) on the front surface of the semiconductor substrate 10 so as to be embedded in the trenches 37a. Next, by photolithography and etching, the polysilicon layer is selectively removed, leaving only portions of the polysilicon layer in the trenches 37a, thereby forming the gate electrodes 39a.

Further, as described above, when the parts of the MOS gates of the main semiconductor device element 11 are formed, the parts of the semiconductor device elements (high-function portions such as the current sensing portion 12, the over-voltage protecting portion (not depicted), and the arithmetic circuit portion (not depicted), refer to FIGS. 2 and 3) fabricated on the same semiconductor substrate 10 suffice to be formed concurrently with the parts of the main semiconductor device element 11 having the same impurity concentration and depth as thereof.

The main semiconductor device element 11 is disposed in the p-type base regions 34a that have an island-like shape and are formed in surface regions of the semiconductor substrate 10, at the front surface thereof and thus, is isolated from other semiconductor device elements fabricated on the single semiconductor substrate 10, by the pn junctions between the p-type base regions 34a and the type drift region 32. The current sensing portion 12 suffices to be disposed having the same structure as that of the main semiconductor device element 11, in the p-type base region 34b that has an island-like shape and is formed in a surface region of the semiconductor substrate 10, at the front surface thereof.

Next, in an entire area of the front surface of the semiconductor substrate 10, the interlayer insulating film 40 containing, for example, borophosphosilicate glass (BPSG), phosphosilicate glass (PSG), etc. is formed so as to cover the gate electrodes 39a and has a thickness of, for example, 1 μm. In the temperature sensing portion 13, the p-type polysilicon layer 81 and the n-type polysilicon layer 82 (refer to FIG. 3) suffice to be formed on the interlayer insulating film 40 and covered by the interlayer insulating film 83.

Next, by photolithography and etching, the first and the second contact holes 40a, 40b that penetrate through the interlayer insulating film 40 and the gate insulating films 38a in the depth direction Z are formed. The third and the fourth contact holes 83a, 83b that penetrate through the interlayer insulating film 83 in the depth direction Z are formed. In the first contact holes 40a, the n$^+$-type source regions 35a and the p$^{++}$-type contact regions 36a of the main semiconductor device element 11 are exposed.

In the second contact holes 40b, the n$^+$-type source regions 35b and the p$^{++}$-type contact regions 36b of the current sensing portion 12 are exposed. In the third and the fourth contact holes 83a, 83b, the p-type polysilicon layer 81 and the n-type polysilicon layer 82 of the temperature sensing portion 13 are exposed, respectively. Next, the interlayer insulating films 40, 83 are planarized by a heat treatment (reflow).

Next, the first TiN film 42a that covers only the interlayer insulating film 40 is formed. Next, on portions of the front surface of the semiconductor substrate 10 exposed in the first contact holes 40a, the NiSi films 41a are formed. Next, the first Ti film 43a, the second TiN film 44a, and the second Ti film 45a are sequentially deposited so as to cover the NiSi films 41a and the first TiN film 42a, thereby forming the barrier metal 46a. Next the source pad 21a is deposited on the second Ti film 45a.

Further, in the second contact holes 40b, the NiSi films 41b and the barrier metal 46b are formed concurrently with and configured similarly to the NiSi films 41a and the barrier metal 46a, respectively. In the second to the fourth contact holes 40b, 83a, 83b, the OC pad 22, the anode pad 23a, and the cathode pad 23b are each formed concurrently with and configured similarly to the source pad 21a.

Further, the drain electrode 51 that is in ohmic contact with the back surface of the semiconductor substrate 10 is formed and on the surface of the drain electrode 51, for example, a Ti film, an Ni film, and a gold (Au) film are sequentially stacked, thereby forming the drain pad (not depicted).

Next, on the front surface of the semiconductor substrate 10, the first protective films 49a to 49c containing polyimide are selectively formed and in openings of the first protective films 49a to 49c, the different electrode pads 21a, 22, 23a, 23b are exposed. Next, on portions of the electrode pads 21a, 22, 23a, 23b exposed in the openings of the first protective films 49a to 49c, the plating films 47a to 47d are formed by a general plating process after a general plating pretreatment.

Next, the plating films 47a to 47d are dried by a heat treatment (baking). Next, the second protective films 50a to 50c that contain polyimide are formed covering borders between the plating films 47a to 47d and the first protective films 49a to 49c. Next, the strength of the polyimide films (the first protective films 49a to 49c and the second protective films 50a to 50c) is enhanced by a heat treatment (curing). Next, on the plating films 47a to 47d, the terminal pins 48a to 48d are respectively bonded by a solder layer.

While not depicted, concurrently with the wiring structures on the electrode pads 21a, 22, 23a, 23b, a first protective film, a plating film, and a second protective film are sequentially formed on the gate pad 21b, and a wiring structure in which terminal pins are bonded by a solder layer is formed. Thereafter, the semiconductor substrate 10 (semiconductor wafer) is diced (cut) into individual chips, whereby the semiconductor device 20 depicted in FIGS. 1 to 5 is completed.

As described above, according to the embodiment, of the first and the second p$^+$-type regions that mitigate electric field applied to the bottoms of the trenches, the first p$^+$-type regions that face the bottoms of the trenches in the depth direction are disposed periodically in the first direction, whereby the first p$^+$-type regions may be partially reduced in number as compared to the conventional structure. As a result, the path of the current that flows when the main semiconductor device element is ON partially widens in the JFET region and therefore, even when a width between the first and the second p$^+$-type regions that are adjacent to one another decreases accompanying size reductions of the unit cells of the main semiconductor device element, the JFET resistance of the main semiconductor device element is reduced and the ON resistance decreases.

Further, according to the embodiment, of the first and the second p$^+$-type regions that mitigate electric field applied to the bottoms of the trenches, the second p$^+$-type regions that are respectively disposed between adjacent trenches of the trenches extend to have a length substantially equal to the length of the trenches in the first direction. Further, in portions facing the bottoms of the trenches, the width of the portions thereof free of the first p$^+$-type regions is limited to at most 1.0 μm. As a result, even when the portions facing the bottoms of the trenches are partially free of the first p$^+$-type regions, in the portions free of the first p$^+$-type regions, electric field applied to the bottoms of the trenches is mitigated by the second p$^+$-type regions. Therefore, application of high electric field to parts of the bottoms of the trenches may be suppressed.

Therefore, an entire area of the bottoms of the trenches are protected by the first and the second p$^+$-type regions, thereby enabling a predetermined breakdown voltage to be obtained, and the ON resistance of the main semiconductor device element is reduced by partially reducing the first p$^+$-type regions in number, thereby enabling the current capability of the main semiconductor device element to be enhanced. Further, application of high electric field to the trench bottoms is suppressed, whereby during turn ON, of the positive hole current flowing in the type drift region 32 to the source electrode, decreases in the current amount (interrupting current amount) discharged by the source electrode may be suppressed.

Further, in a MOSFET containing silicon as a semiconductor material, a trench gate structure is used to reduce the size of the unit cells and eliminate the JFET resistance to reduce the ON resistance. Even with a trench gate structure, the load of the electric field may be borne by pn junctions between the p-type base regions and the n$^-$-type drift region, whereby high electric field is not applied to the gate insulating films at the trench bottoms. Therefore, the first and the second p$^+$-type regions that mitigate electric field applied to the trench bottoms as in the conventional structure (refer to FIGS. 13 and 14) are unnecessary.

Meanwhile, in the MOSFET containing silicon carbide as a semiconductor material, a trench gate structure is taken, whereby the size of the unit cells is reduced, and channel mobility increases, reducing the ON resistance. Further, increase of the channel mobility enables reduction of the thickness of the epitaxial layers stacked on the semiconductor substrate. On the other hand, the bandgap is 3 eV, which is wider than that of silicon and therefore, the load of the electric field cannot be borne by the pn junctions between the p-type base regions and the type drift region, whereby high electric field is applied to the gate insulating films at the trench bottoms.

Thus, like the conventional structure, while a configuration has be proposed in which the first and the second p$^+$-type regions that mitigate electric field applied to the trench bottoms are provided in a striped pattern extending along the front surface of the semiconductor substrate, the JFET resistance occurs due to the pn junctions between the first and the second p$^+$-type regions and the n-type current spreading region, and the greater the size of the unit cells is reduced, the greater is the JFET resistance. According to the embodiment, as described above, even when the first and the second p$^+$-type regions are provided, the JFET resistance is reduced and reduction of the ON resistance is realized while various characteristics (low ON voltage, high-speed characteristics, high temperature characteristics) due to properties of silicon carbide may be obtained.

Further, according to the embodiment, by merely changing the pattern of an ion implantation mask for forming the first and the second p$^+$-type regions that mitigate electric field applied to the trench bottoms, manufacturing processes similar to those for the conventional structure may be used and therefore, fabrication of the main semiconductor device element is facilitated.

Breakdown voltage characteristics and ON resistance characteristics of the main semiconductor device element 11 were verified. FIG. 12 is a characteristics diagram depicting breakdown voltage characteristics and ON resistance characteristics of an example. In FIG. 12, a horizontal axis represents the interval w2 between the first p$^+$-type regions 61a that are adjacent to each other in the first direction X. In FIG. 12, a vertical axis on the left represents ON resistance while a vertical axis on the right represents breakdown voltage.

Figure 12:
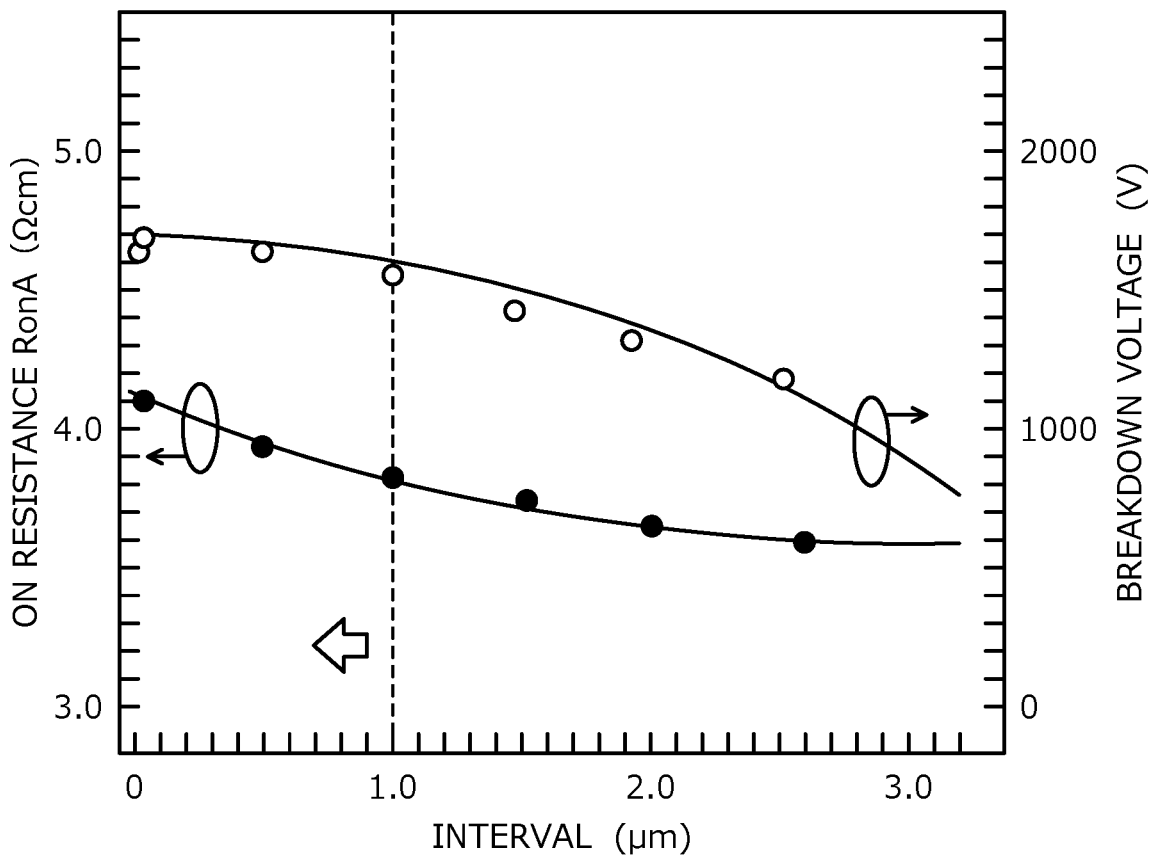
FIG. 12 is a characteristics diagram depicting breakdown voltage characteristics and ON resistance characteristics of an example.

For multiple samples (hereinafter, example) each having the structure of the main semiconductor device element 11 (refer to FIGS. 2 to 5) of the semiconductor device 20 according to the embodiment described above, results of measurement of breakdown voltage and ON resistance are depicted in FIG. 12. In the example, a breakdown voltage of 1200V was assumed. The interval w2 between the first p$^+$-type regions 61a that are adjacent to each other in the first direction X differed in each of the multiple samples of the example.

For comparison, results of measurement of the breakdown voltage and the ON resistance of the main semiconductor device element (hereinafter, conventional example, refer to FIGS. 13 and 14) of the conventional semiconductor device 220 are also shown in FIG. 12. The conventional example differs from the example in that the first p$^+$-type regions 261 are the same length as the trenches 237 and extend in a linear shape in the first direction X. A curve indicating the breakdown voltage of the conventional example is similar to that of the example. The sample in which the interval=0 μm on the horizontal axis in FIG. 12 is the conventional example.

From the results depicted in FIG. 12, it was confirmed that for the example, the ON resistance could be reduced as compared to the conventional example. A reason for this is that the first p$^+$-type regions 61a that face the trenches 37a in the depth direction Z are partially reduced in number, whereby the path of the current that flows in the ON state is widened by the portions free of the first p$^+$-type regions 61a, thereby enabling reduction of the channel resistance.

Further, it was confirmed that in the example, as the interval w2 between the first p$^+$-type regions 61a that are adjacent to each other in the first direction X is increased, the ON resistance is reduced. On the other hand, it was confirmed that in the example, as the interval w2 between the first p$^+$-type regions 61a that are adjacent to each other in the first direction X is increased, the breakdown voltage decreases more as compared to the conventional example.

A reason for this is that as the interval w2 between the first p$^+$-type regions 61a that are adjacent to each other in the first direction X is increased, at portions free of the first p$^+$-type regions 61a, high electric field is easily applied to the bottoms of the trenches 37a. Further, positive hole current that flows in the n$^-$-type drift region 32 to the source electrode during turn OFF concentrates at locations where high electric field concentrates at the bottoms of the trenches 37a.

As a result, of the positive hole current, the current (interrupting current amount) discharged by the source electrode decreases. Therefore, the interval w2 between the first p$^+$-type regions 61a that are adjacent to each other in the first direction X may be set to an interval that may ensure a predetermined ON resistance and suppress application of high electric field to the bottoms of the trenches 37a at the portions free of the first p$^+$-type regions 61a.

In particular, a reverse bias safe operating area (RBSOA) may be set allowing some leeway, the interval w2 between the first p$^+$-type regions 61a that are adjacent to each other in the first direction X may be set to be at most about 1.0 μm (to the left side of the dashed vertical line), and a breakdown voltage that is about 1.2 times of the breakdown voltage rating (for example, about 1500V) may be secured.

While not depicted, even in instances in which the predetermined breakdown voltage rating of the example was variously changed, results similar to those depicted in FIG. 12 could be obtained.

In the foregoing, the invention is not limited to the embodiments described above and various modifications within a range not departing from the spirit of the invention are possible. For example, instead of silicon carbide as a semiconductor material, the present invention is applicable even in an instance of a wide bandgap semiconductor other than silicon carbide. Further, the invention is similarly implemented when the conductivity types (n-type, p-type) are reversed.

According to the invention described above, the path of the current that flows from a second electrode to a first electrode during the ON state may be partially widened near the pn junctions between the first and the second high-concentration regions and the first semiconductor region, whereby the JFET resistance that occurs due to the pn junctions between the first and the second high-concentration regions and the first semiconductor region may be reduced.

The semiconductor device according to the present invention achieves an effect in that ON resistance may be reduced.

As described above, the semiconductor device according to the present invention is useful for power semiconductor devices that control high voltage and/or large current.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate containing a semiconductor having a bandgap wider than a bandgap of silicon, the semiconductor substrate having a first main surface and a second main surface opposite to each other;
   a first semiconductor region of a first conductivity type, provided in the semiconductor substrate;
   a plurality of second semiconductor regions of a second conductivity type, provided between the first main surface of the semiconductor substrate and the first semiconductor region;
   a plurality of third semiconductor regions of the first conductivity type, selectively provided between the first main surface of the semiconductor substrate and the second semiconductor regions;
   a plurality of trenches penetrating through the third semiconductor regions and the second semiconductor regions, respectively and reaching the first semiconductor region;
   a plurality of first high-concentration regions of the second conductivity type, selectively provided in the first semiconductor region, each facing a bottom of one of the trenches in a depth direction, and having an impurity concentration higher than an impurity concentration of the second semiconductor regions;
   a plurality of second high-concentration regions of the second conductivity type, selectively provided in the first semiconductor region, separate from any one of the first high-concentration regions and the trenches, each second high-concentration region being in contact with one of the second semiconductor regions, reaching a position further from the second semiconductor regions in the depth direction than are respective bottoms of the trenches and having an impurity concentration higher than the impurity concentration of the second semiconductor regions;
   a plurality of gate electrodes respectively provided in the trenches via a plurality of gate insulating films;
   a first electrode electrically connected to the second semiconductor regions, the third semiconductor regions, the first high-concentration regions, and the second high-concentration regions; and
   a second electrode provided on the second main surface of the semiconductor substrate, wherein
   the trenches each have a linear shape extending in a first direction that is parallel to the first main surface of the semiconductor substrate,
   the first high-concentration regions are successively separated in the first direction by intervals therebetween, each of which is at most 1.0 μm, and
   the second high-concentration regions each have a linear shape extending in the first direction.

2. The semiconductor device according to claim 1, wherein
   a first length in the first direction of any adjacent two of the first high-concentration regions is at most 1.0 μm.

3. The semiconductor device according to claim 2, wherein
   the first length of the any adjacent two of the first high-concentration regions in the first direction is equal to the length of each of the intervals between the first high-concentration regions disposed in the first direction.

4. The semiconductor device according to claim 3, wherein
   the first length of the any adjacent two of the first high-concentration regions in the first direction is narrower than a second length of any adjacent two of the first high-concentration regions in a second direction that is parallel to the first main surface of the semiconductor substrate and orthogonal to the first direction.

5. The semiconductor device according to claim 4, wherein
   the second length of the any adjacent two of the first high-concentration regions in the second direction is in a range from 50% to 150% of a width of the trenches in the second direction.

6. The semiconductor device according to claim 1, wherein
   the first high-concentration regions are electrically connected to the second high-concentration regions.

7. The semiconductor device according to claim 6, wherein
   an end of each of the first high-concentration regions is in contact with one of the second high-concentration regions, and
   the first high-concentration regions and the second high-concentration regions form a ladder-like shape.

* * * * *